United States Patent
Ohsumi

(10) Patent No.: US 7,667,315 B2
(45) Date of Patent: Feb. 23, 2010

(54) SEMICONDUCTOR DEVICE HAVING A FRAME PORTION AND AN OPENING PORTION WITH MOUNTABLE SEMICONDUCTOR CHIPS THEREIN

(75) Inventor: Takashi Ohsumi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 125 days.

(21) Appl. No.: 11/364,008

(22) Filed: Mar. 1, 2006

(65) Prior Publication Data
US 2006/0214288 A1    Sep. 28, 2006

(30) Foreign Application Priority Data
Mar. 2, 2005    (JP) .............................. 2005-057799

(51) Int. Cl.
*H01L 23/48* (2006.01)

(52) U.S. Cl. ..................... 257/690; 257/693; 257/698; 257/725; 257/E23.169

(58) Field of Classification Search ................. 257/724, 257/725, E23.169, 690, 693, 698
See application file for complete search history.

(56) References Cited

U.S. PATENT DOCUMENTS

| | | | |
|---|---|---|---|
| 6,320,267 B1 * | 11/2001 | Yukawa | ....................... 257/784 |
| 6,765,299 B2 | 7/2004 | Takahashi et al. | |
| 2004/0089944 A1 | 5/2004 | Watanabe | |
| 2004/0089957 A1 | 5/2004 | Shizuno | |
| 2004/0099955 A1 | 5/2004 | Shizuno | |
| 2004/0154417 A1 * | 8/2004 | Renken et al. | .............. 73/866.1 |
| 2006/0008944 A1 * | 1/2006 | Shizuno | ...................... 438/109 |
| 2006/0138638 A1 * | 6/2006 | Komatsu | ..................... 257/700 |

FOREIGN PATENT DOCUMENTS

| | | | |
|---|---|---|---|
| JP | 2001-257310 | | 9/2001 |
| JP | 2003046255 A | * | 2/2003 |
| JP | 2004-165190 | | 6/2004 |
| JP | 2004-165192 | | 6/2004 |
| JP | 2004-165194 | | 6/2004 |

* cited by examiner

*Primary Examiner*—Davienne Monbleau
*Assistant Examiner*—Christopher M Roland
(74) *Attorney, Agent, or Firm*—Rabin & Berdo, PC

(57) ABSTRACT

A semiconductor chip includes a semiconductor substrate having an opening portion and a frame portion defining a periphery of the opening portion. At least one electric element is provided on the frame portion, and has at least one electrode terminal. A first insulation film is formed on the frame portion so that the electrode terminal is partially exposed at the first insulation film to form a plurality of electrode pads.

13 Claims, 14 Drawing Sheets

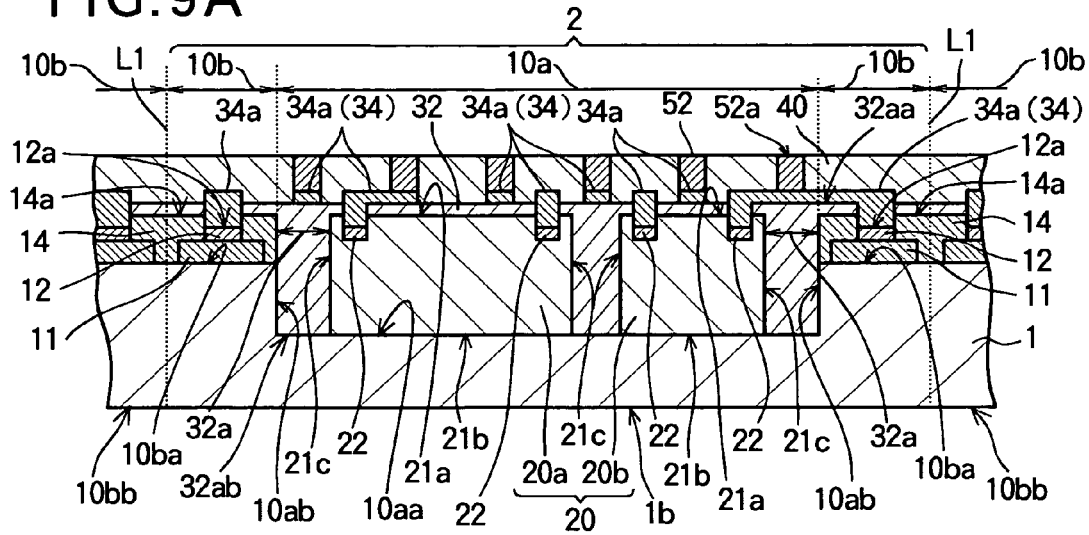
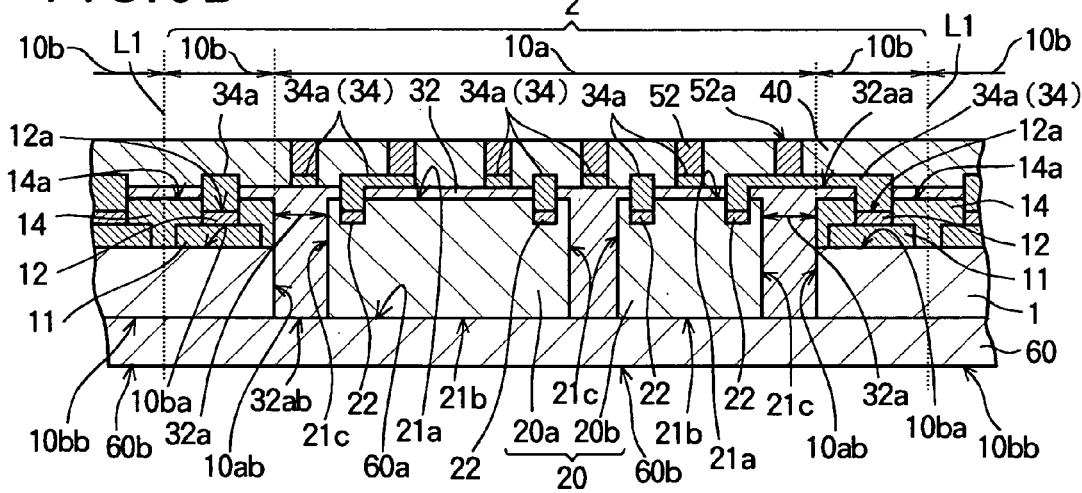
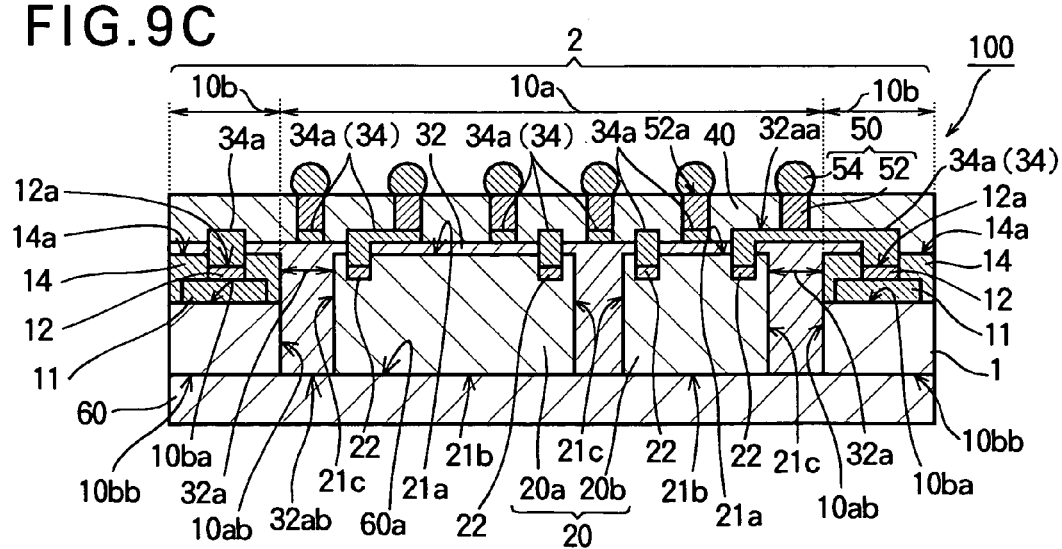

SEMICONDUCTOR DEVICE HAVING A FRAME PORTION AND AN OPENING PORTION WITH MOUNTABLE SEMICONDUCTOR CHIPS THEREIN

BACKGROUND OF THE INVENTION

This invention relates to a semiconductor device having System-In-Package (SIP) structure.

The semiconductor device of the SIP structure is formed by sealing a plurality of semiconductor chips in a single package to form an integrated system. The semiconductor device of the SIP structure has advantages of low electric power consumption, high performance, and small mounting area.

Particularly, there is known a semiconductor device called as Wafer-Level SIP, which is formed by sealing the semiconductor chips on a wafer and separating the wafer into individual semiconductor devices.

For example, there is known a semiconductor device of the SIP structure in which a second semiconductor chip is laminated on a first semiconductor chip, and a protection film (thicker than the second semiconductor chip) is formed on the first semiconductor chip. The protection film has a hole (having the same size as the second semiconductor chip) in which the second semiconductor chip is mounted.

Such a semiconductor deice has a wiring layer connected to the first and second semiconductor chips, and electrode posts connected to the wiring layer. The top surfaces of the electrode posts are exposed at the surface of a sealing resin layer covering the surface of the semiconductor chips. Solder balls are connected to the top surfaces of the electrode posts (see Japanese Laid-Open Patent Publication No. 2001-257310: referred to as Patent Publication 1).

Further, in order to increase the interval between electrode terminals, there is known a semiconductor device including a base frame (made of, for example, an organic material) having an opening portion, and a semiconductor chip mounted therein having a plurality of electrode pads. Such a semiconductor device includes wiring patterns running from the electrode pads of the semiconductor device to the surface of the base frame, and electrode terminals formed on the wiring patterns at the surface of the substrate (see Japanese Laid-Open Patent Publication No. 2004-165190: referred to as Patent Publication 2).

Furthermore, in order to increase the interval between electrode terminals, there is known a semiconductor device having an extension portion (made of, for example, a resin) that contacts and surrounds the side surfaces of the semiconductor chip. Above the extension portion, electrode terminals are formed on the wiring patterns running from the electrode pads of the semiconductor chip (see Japanese Laid-Open Patent Publication No. 2004-165192: referred to as Patent Publication 3).

Moreover, there is known a semiconductor device having an insulating extension portion (made of, for example, a resin) that contacts and surrounds the side surfaces of the semiconductor chip. Above the extension portion, electrode terminals are formed on the wiring patterns running from the electrode pads of the semiconductor chip (see Japanese Laid-Open Patent Publication No. 2004-165194: referred to as Patent Publication 4).

However, in the semiconductor device disclosed in Patent Publication 1 having laminated semiconductor chips, the heat generated by the respective semiconductor chips is not well dissipated, and therefore the heat may adversely affects the operation of the semiconductor chips or the like.

Further, in the semiconductor devices disclosed in Patent Publications 2, 3 and 4, the semiconductor chips are surrounded by the base frame (Patent Publication 2) or the extension portion (Patent Publications 3 and 4) made of, for example, resin or organic material, and therefore the heat dissipation of the semiconductor chips may be reduced, so that the high-frequency characteristics may be adversely affected.

Accordingly, there is a demand for a semiconductor device capable of providing higher performance of a package, enhancing heat dissipation and high-frequency characteristics, and enhancing the stability in operation.

SUMMARY OF THE INVENTION

An object of the present invention is to provide a semiconductor device capable of providing higher performance of a package, enhancing heat dissipation and high-frequency characteristics, reducing the influence of the noise, and enabling easy lamination.

The present invention provides a semiconductor chip including a semiconductor substrate having an opening portion and a frame portion defining a periphery of the opening portion, at least one electric element provided on the frame portion and having an electrode terminal, and a first insulation film formed on the frame portion so that the electrode terminal is partially exposed at the first insulation film to form a plurality of electrode pads.

A manufacturing method of the semiconductor device comprises the steps of:

(a1) preparing a semiconductor substrate having top and bottom surfaces and including a plurality of chip areas each of which includes an opening-formation area;

(a2) forming at least one electric element around the opening-formation area in the chip area, the electric element having at least one electrode terminal;

(a3) forming a first insulation film so that the electrode terminal is partially exposed at the first insulation film to form electrode pads;

(a4) forming a plurality of opening portions on the opening-formation areas, each of the opening portion reaching the inside of the semiconductor substrate from the surface of the semiconductor substrate and having a bottom surface and side surfaces;

(a5) preparing a plurality of mountable semiconductor chips, each of the mountable semiconductor chips having a first main surface at which a plurality of second electrode pads are exposed and a second main surface opposite to the first main surface;

(a6) mounting at least one mountable semiconductor chip in the plurality of the opening portions so that each mountable semiconductor chip is apart from the side surfaces of the opening portion and so that the second main surface of the mountable semiconductor chip faces the bottom surface of the opening portion;

(a7) forming a second insulation film on the first insulation film and the first main surface so that the first and second electrodes are partially exposed and the opening portion is filled with the second insulation film;

(a8) forming a first wiring layer including a plurality of first wiring portions electrically connected to at least one of the first and second electrode pads and extending on the second insulation film;

(a9) forming a plurality of first external terminals connected to the plurality of the first wiring portions;

(a10) forming a first sealing portion on the first wiring layer and the second insulation film so that the first external terminals are exposed; and (a11) cutting the plurality of the chip areas into individual semiconductor devices.

Another manufacturing method of the semiconductor device comprises the steps of:

(b1) preparing a semiconductor substrate having top and bottom surfaces and including a plurality of chip areas each of which includes an opening-formation area;

(b2) forming at least one electric element around the opening-formation area in the chip area, the electric element having at least one electrode terminal;

(b3) forming a first insulation film so that the electrode terminal is partially exposed at the first insulation film to form electrode pads;

(b4) forming a plurality of opening portions on the opening-formation areas, each of the opening portion reaching the inside of the semiconductor substrate from the surface of the semiconductor substrate and having a bottom surface and side surfaces;

(b5) preparing a plurality of mountable semiconductor chips, each of the mountable semiconductor chips having a first main surface at which a plurality of second electrode pads are exposed and a second main surface opposite to the first main surface;

(b6) mounting at least one mountable semiconductor chip in the plurality of the opening portions so that each mountable semiconductor chip is apart from the side surfaces of the opening portion and so that the second main surface of the mountable semiconductor chip faces the bottom surface of the opening portion;

(b7) forming a second insulation film on the first insulation film and the first main surface so that the first and second electrodes are partially exposed and the opening portion is filled with the second insulation film to form a filled portion;

(b8) forming a through hole reaching the bottom surface of the opening portion form the surface of the filled portion;

(b9) embedding the through hole with electric conducting material to form an embedded wiring;

(b10) forming a first wiring layer including a plurality of first wiring portions electrically connected to at least one of or any combination of a top end of the embedded wiring, the first and second electrode pads, the first wiring portions extending on the second insulation film;

(b11) forming a plurality of first external terminals connected to the plurality of the first wiring portions;

(b12) forming a first sealing portion on the first wiring layer and the second insulation film so that the first external terminals are exposed;

(b13) grinding a bottom surface of the semiconductor substrate so that the second main surface of the mountable semiconductor chip and a bottom end of the embedded wiring are exposed;

(b14) forming the third insulation film covering the second main surface of the mountable semiconductor chip and the bottom surface of the frame portion so that the bottom end of the embedded wiring is exposed;

(b15) forming the second wiring layer including a plurality of second wiring portion electrically connected to the bottom end of the embedded wiring, and extending on the third insulation film;

(b16) forming the second sealing portion so that the plurality of the second wiring portions are partially exposed to form a plurality of second external terminals; and (b17) cutting the plurality of chip areas into individual semiconductor devices.

In the above described steps (a2) and (b2), it is possible to form at least one passive element.

In the above described steps (a6) and (b6), it is possible to mount a plurality of the mountable semiconductor chips in the opening so that the mountable semiconductor chips are apart from each other.

In the above described step (b8), it is possible to form the through hole on the filled portion between the adjacent mountable semiconductor chips.

In the above described step (b11), it is possible to form a plurality of electrode posts on the plurality of first wiring portions after the first wiring layer is formed. In the above described step (b12), it is possible to form the first sealing portion on the first wiring layer and the second insulation film so that the top surfaces of the electrode posts are exposed.

After the above described step (b12), it is possible to mount solder balls on the top surfaces of the exposed electrode posts.

BRIEF DESCRIPTION OF THE DRAWINGS

In the attached drawings:

FIGS. 9A through 9C are schematic sectional views illustrating the manufacturing process taken along a line corresponding to Line IVB-IVB in FIG. 4A;

DETAILED DESCRIPTION OF THE PREFERRED EMBODIMENT

Embodiments of the present invention will be described with reference to the attached drawings.

First Embodiment

The first embodiment of the present invention will be described with reference to FIGS. 1A and 1B. The first embodiment relates to a frame-shaped semiconductor chip.

(1) Structure of Frame-Shaped Semiconductor Chip

Figure 1A:
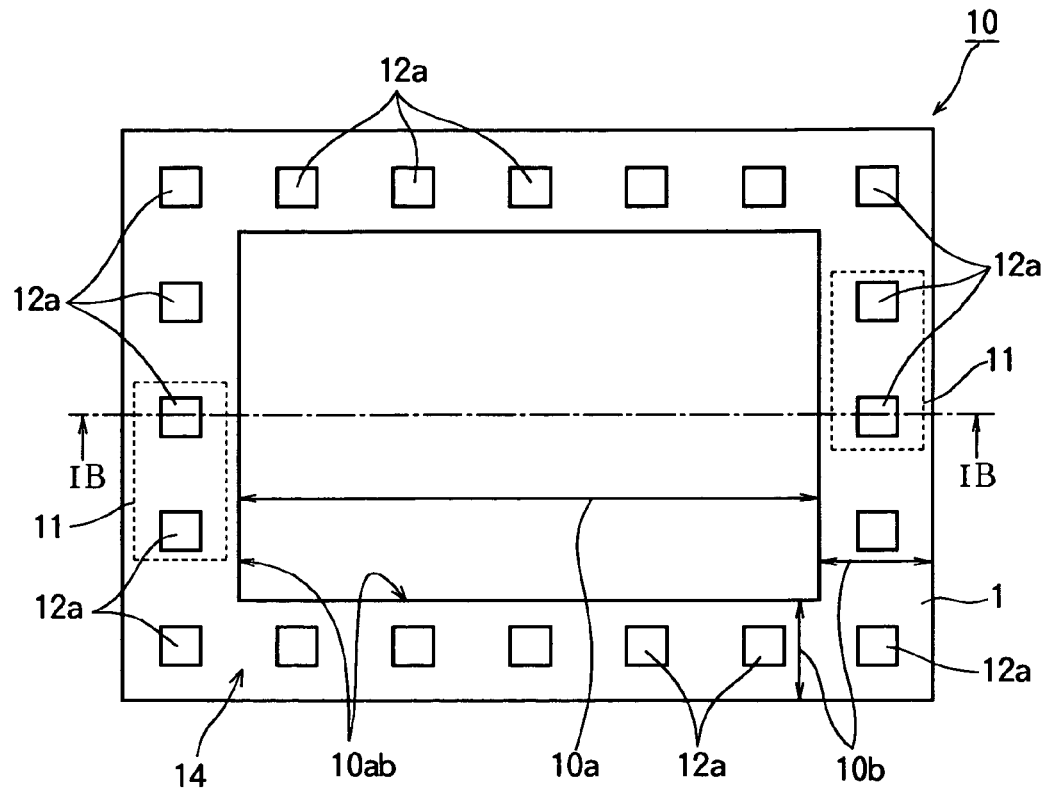
FIG. 1A is a schematic plan view illustrating a structure of a frame-shaped semiconductor chip.

FIG. 1A is a schematic plan view of a frame-shaped semiconductor chip according to the first embodiment, as seen from above. FIG. 1B is a schematic sectional view taken along line IB-IB in FIG. 1A.

Figure 1B:
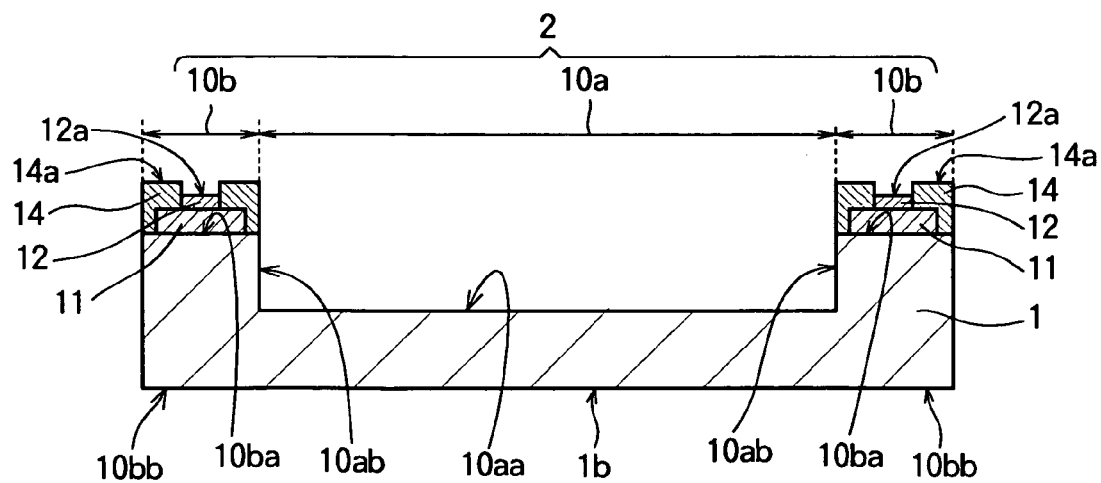
FIG. 1B is a sectional view taken along Line IB-IB in FIG. 1A.

As shown in FIGS. 1A and 1B, the frame-shaped semiconductor chip 10 is formed on a semiconductor substrate 1 such as a silicon wafer.

The frame-shaped semiconductor chip 10 includes the semiconductor substrate 1 having an opening portion 10a and a frame portion 10b that constitutes a periphery around the opening portion 10a.

The frame-shaped semiconductor chip 10 is in the shape of, for example, a square. The frame portion 10b has a top surface 10ba and a bottom surface 10bb. The bottom surface 10bb is aligned with a bottom surface 1b of the semiconductor substrate 1.

Figure 2A:
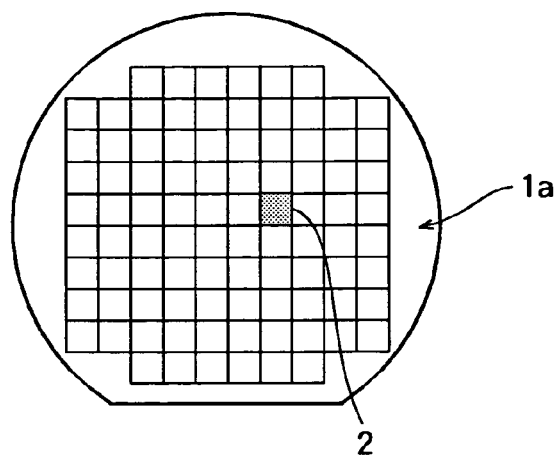
FIGS. 2A and 2B are schematic views illustrating a manufacturing process of the frame-shaped semiconductor chip.

The opening portion 10a is formed on the center of the frame-shaped semiconductor chip 10 and surrounded by the frame portion 10b. The opening portion 10a is a concave portion as shown in FIGS. 2A and 2C, and has a depth reaching the inside of the semiconductor substrate 1 from a surface 1a of the semiconductor substrate 1. The opening portion 10a is in the shape of, for example, a rectangle as seen from above. The opening portion 10a has a bottom surface 10aa and side surfaces. 10ab both defined by the frame portion 10b. It is also possible to constitute the opening portion 10a by a through-hole having no bottom surface 10aa, if desired.

In this example, the frame-shaped semiconductor chip 10 has only one opening portion 10a. However, it is also possible to form two opening portions 10a or more on the frame-shaped semiconductor chip 10.

At least one electric element 11 is formed on the frame portion 10b. The electric element 11 is preferably a passive element. As the passive element, it is preferable to select one of (or combine at least two of) elements such as antenna, inductor, resistance and capacitor. In the following explanation, the electric element will be referred to as the passive element, when needed.

The electric element 11 is formed on a top surface 10ba of the frame portion 10b, by means of a usual wafer process.

For example, it is possible to provide the passive element (such as the resistance, the capacitor or the like) as a laminated structural body, i.e., an integrated circuit.

It is preferable to provide a plurality of electric elements 11 of different kinds. Further, it is preferable to obtain a multipurpose electric element 11 by providing a plurality of specifications on each kind of electric element 11. For example, the electric elements 11 can be composed of a plurality of capacitors with different capacitances formed on the frame portion 10b. Further, the electric elements 11 can be composed of a plurality of resistances with different specifications (i.e., different values of resistance) formed on the frame portion 10b. Similarly, the electric elements 11 can be composed of a plurality of electric elements (such as inductors) with different specifications formed on the frame portion 10b.

If the frame-shaped semiconductor chip 10 has the electric elements 11 with a plurality of kinds and specifications (i.e., multifunction electric elements 11), it becomes possible to broaden the range of options of the kinds and specifications of mountable semiconductor chips to be mounted in the opening portion 10a (described later) In other words, it is possible to mount different kinds of mountable semiconductor chips in the opening portions 10a of the frame-shaped semiconductor chips 10 having the same structures, and to selectively connect the mountable semiconductor chips and the electric elements 11 of the suitable kinds and suitable specification.

A first insulation film 14 is formed on the entire top surface of the frame portion 10b. In other words, the first insulation film 14 covers the electric elements 11.

Each of the electric elements 11 formed on the frame portion 10b has at least one electrode terminal 12 to be connected to an external device. In this example, each electric element 11 has two electrode terminals 12. The first insulation film 14 is so formed that parts of the electrode terminals 12 are exposed at the first insulation film 14. The exposed parts of the electrode terminals 12 constitute first electrode pads 12a. In this example, the first electrode pads 12a are arranged on the frame portion 10b along the periphery of the opening portion 10a at constant intervals.

The frame-shaped semiconductor chip 10 can be used individually as shown in FIG. 1. It is considered to apply the manufacturing process of wafer-level chip size package (i.e., the manufacturing process in which the packaging operation is carried out at the wafer level) to the manufacturing of the frame-shaped semiconductor chip 10.

The frame-shaped semiconductor chip 10 can be used in a modification in which a plurality of semiconductor chips are arranged in a matrix on the semiconductor substrate.

(2) Manufacturing Method of Frame-Shaped Semiconductor Chip

The manufacturing method of the frame-shaped semiconductor chip will be described with reference to FIGS. 2A through 3C.

Figure 2B:
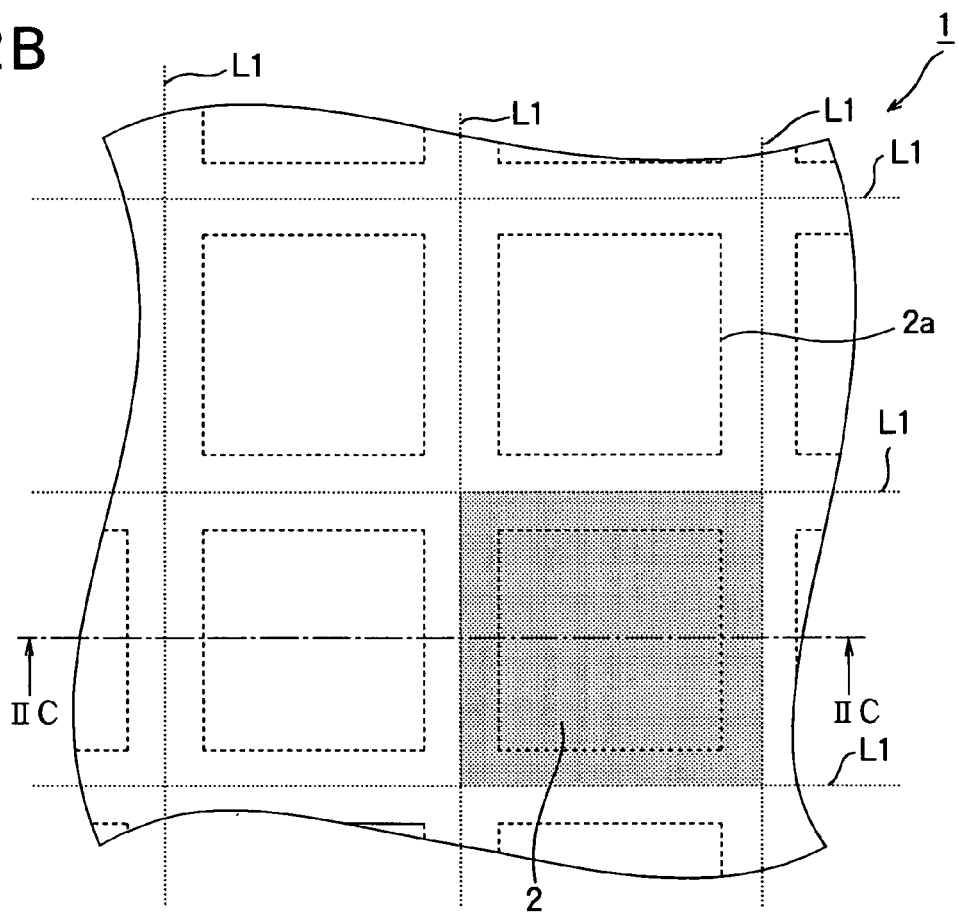
Figure 2C:
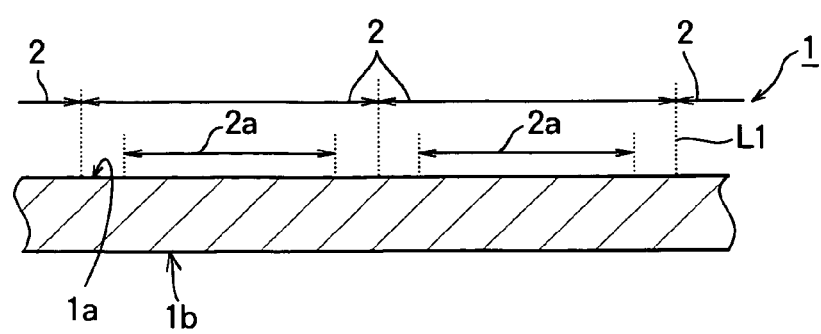
FIG. 2C is a schematic sectional view taken along Line IIC-IIC in FIG. 2B.

FIGS. 2A and 2B are schematic views illustrating a manufacturing process of the semiconductor chip, as seen from above. FIG. 2C is a schematic sectional view taken along Line IIC-IIC in FIG. 2B.

Figure 3A:
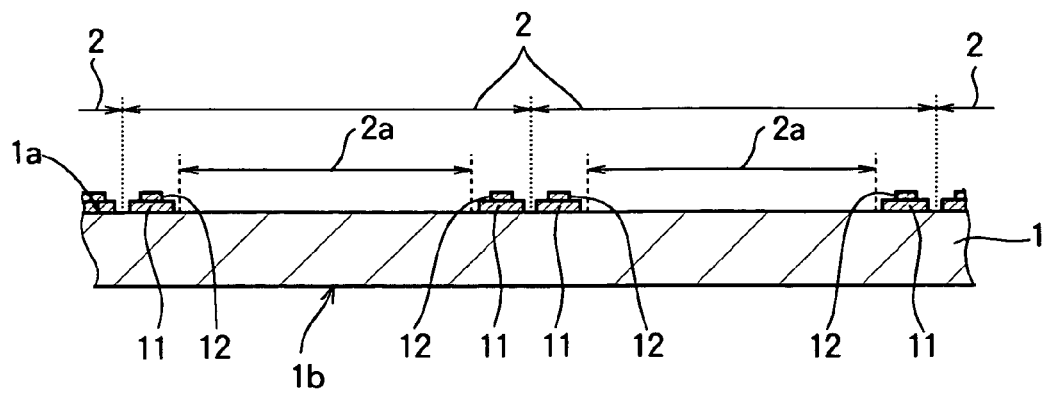
FIGS. 3A through 3C are sectional views illustrating the manufacturing process following the step of FIG. 2C.
Figure 3B:
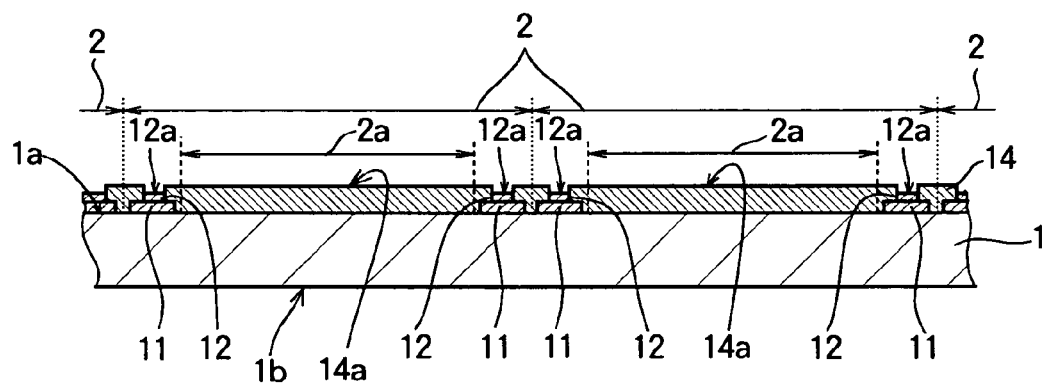
Figure 3C:
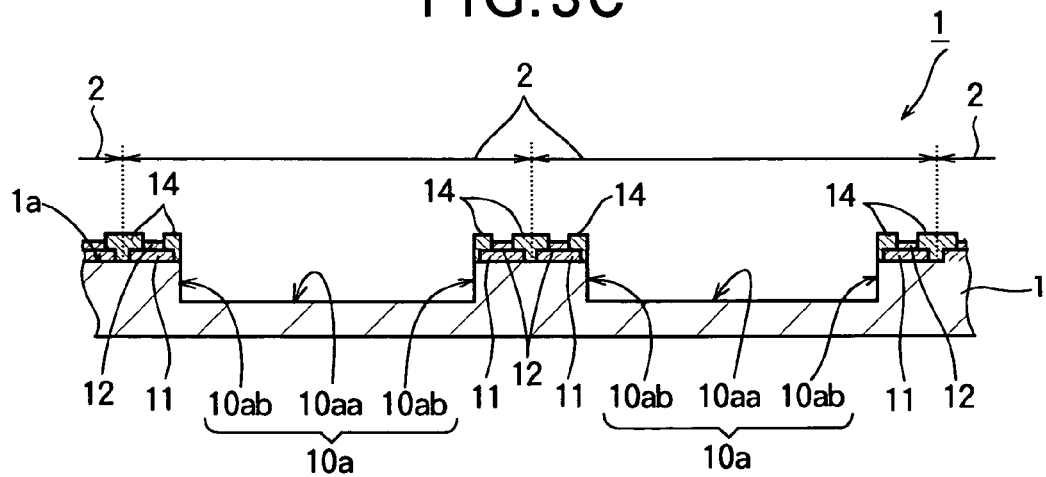

FIGS. 3A through 3C are sectional views illustrating the manufacturing process following the step of FIG. 2C.

First, an arbitrary suitable semiconductor substrate 1 is prepared. In this example, the semiconductor substrate 1 is a silicon wafer.

As shown in FIGS. 2A and 2B, a plurality of divided chip areas 2 are formed on the semiconductor substrate 1, and the chip areas 2 are arranged in a matrix. The borders between the adjacent chip areas 2 are indicated by lines L1. Each line L1 is used as a scrub line in the posterior step of the manufacturing process. Further, an opening-formation area 2a is defined in each of the chip areas 2.

As shown in FIG. 2C, the semiconductor substrate 1 has a top surface 1a and a bottom surface 1b opposite to the surface 1a.

As shown in FIG. 3A, the electric elements 11 are formed on the semiconductor substrate 1 by means of conventional wafer process. The electric elements 11 are formed on the outer areas around the opening-formation areas 2a of the chip areas 2 of the semiconductor substrate 1.

For example, a spiral inductor can be formed by forming a spiral conductive wiring pattern on the surface 1a of the semiconductor substrate 1. For example, a resistance element can be formed by selecting a material having a resistivity such as tantalum nitride (TaN) and Ni (nickel)—Cr (Chrome) Alloy, and by selecting a process suitable for the selected material.

The resistance element can be formed of a laminated wiring structure (including an interlayer insulation film, via holes and wiring portions filled in the via holes) on the surface 1a, by means of a conventional wafer process.

As shown in FIG. 3B, a first insulation film 14 is formed to be a passivation film covering the electric elements 11.

In this step, parts of the electrode terminals 12 of the electric elements 11 are exposed at the surface 14a of the first insulation film 14. To be more specific, after the first insulation film 14 is formed to cover the entire surface of the electrode terminals 12, the parts of the electrode terminals 12 of the electric elements 11 are exposed by means of, for example, a photolithographic process and an etching process. The exposed parts of the electrode terminals 12 constitute first electrode pads 12a.

The first insulation film 14 is preferably made of, for example, a silicon nitride film. The first insulation film 14 can be formed by using a conventional insulation material and by selecting a conventional patterning process suitable for the selected material.

As shown in FIG. 3C, the opening portion 10a is formed on the opening-formation area 2a of each chip area 2 so that the opening portion 10a reaches the inside of the semiconductor substrate 1 from the top surface 1a. It is also possible to form the opening portion 10a as a through hole reaching the bottom surface 1b of the semiconductor substrate 1 from the top surface 1a.

The opening portions 10a can be formed by a conventional process such as a conventional dry etching process. Each of the opening portion 10a is formed to have the shape and depth sufficient for mounting the mountable semiconductor chip (described later) therein. That is, the opening portion 10a can be formed in accordance with the shape and size of the mountable semiconductor chip.

The opening portion 10a can be formed to have arbitrary and suitable shape, by means of a conventional patterning process used in MEMS (Micro Electrical Mechanical Systems). The opening portion 10a can be formed in a similar manner to the forming step of the weight portion of the acceleration sensor.

To be more specific, the opening portion 10a can be formed by the engraving using a dry etching process suitable for the material of the semiconductor substrate 1. In this example, the opening portion 10a is a rectangular concave portion. Further, in this example, the opening portion 10a is formed to have a bottom surface 1aa and the side surfaces 10ab.

As described above, the formation of the frame-shaped semiconductor chip 10 at the wafer level is completed. If needed, the wafer is cut along the scrub lines L1 shown in FIG. 2B into the respective frame-shaped semiconductor chips 10, so that each frame-shaped semiconductor chip 10 can be used as a single chip.

With the above process, the frame-shaped semiconductor chip 10 can be efficiently formed.

Second Embodiment

The second embodiment of the present invention will be described with reference to FIGS. 4A through FIGS. 7C. The second embodiment relates to a semiconductor device using the above described frame-shaped semiconductor chip 10, i.e., a semiconductor device of the SIP structure.

(1) Structure of Semiconductor Device (SIP)

Figure 4A:
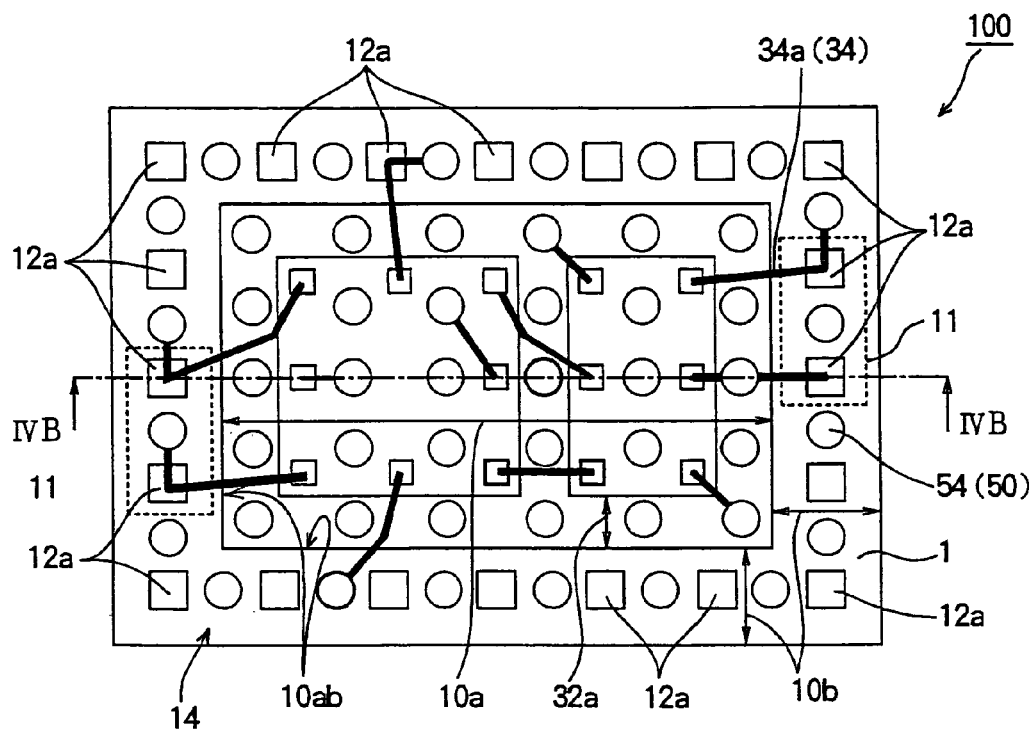
FIG. 4A is a schematic plan view illustrating the semiconductor device of the SIP structure.
Figure 4B:
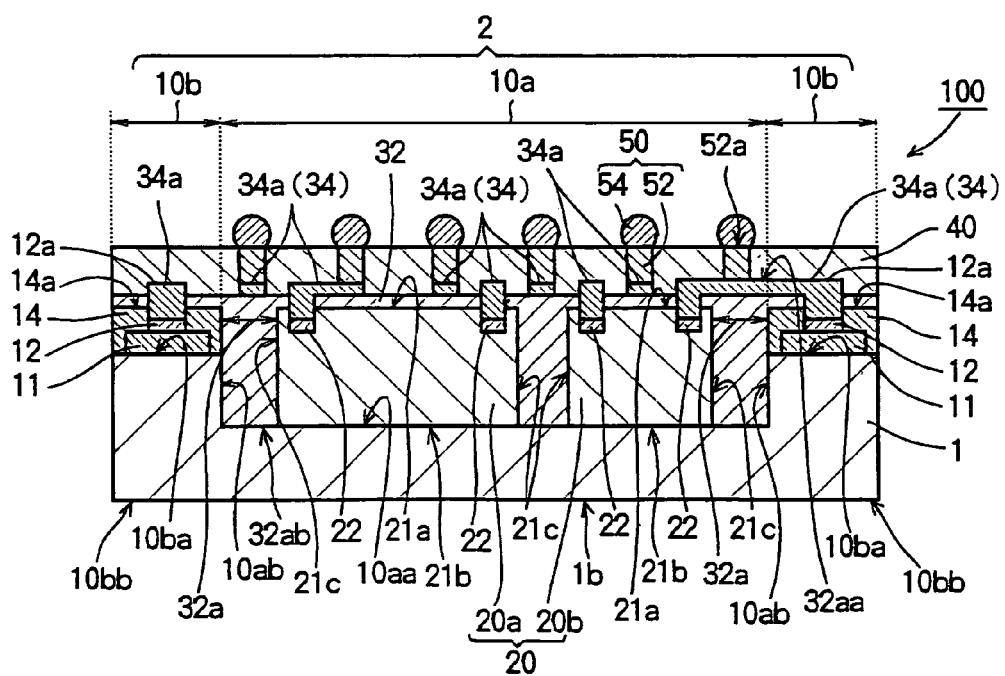
FIG. 4B is a schematic sectional view taken along Line IVB-IVB in FIG. 4A.

FIG. 4A is a schematic plan view illustrating the semiconductor device of the SIP structure. In FIG. 4A, a sealing portion is omitted, in order to clearly show the positional relationship between the electrode pads and the wiring layer. FIG. 4B is a schematic sectional view taken along Line IVB-IVB in FIG. 4A.

As shown in FIGS. 4A and 4B, the semiconductor device 100 of the SIP structure of this embodiment includes the frame-shaped semiconductor chip having above described structure.

At least one mountable semiconductor chip (i.e., second semiconductor chip) 20 is mounted in the opening portion 10a of the frame-shaped semiconductor chip 10.

The mountable semiconductor chip 20 has a first main surface 21a at which a plurality of second electrode pads 22 are exposed, and a second main surface 21b opposite to the first main surface 21a. In this example, the second electrode pads 22 are arranged along the periphery of the first main surface 21a at constant intervals.

To be more specific, the mountable semiconductor chip 20 is mounted in the opening portion 10a in such a manner that the second main surface 21b is bonded to the bottom surface 10aa by means of, for example, a conventional method using an insulating dice-bonding material (not shown).

In this example, two mountable semiconductor chips 20, i.e., a first mountable semiconductor chip 20a and a second mountable semiconductor chip 20b are mounted in the opening 10a. The number of the mountable semiconductor chips 20 is not limited to two, but can be one, three or more.

The first and second mountable semiconductor chips 20a and 20b have the same thickness but have different planer shapes and sizes.

The functions of the mountable semiconductor chips 20 mounted in one opening portion 10a can be the same as each other, or can be different from each other. Further, the shapes of the mountable semiconductor chips 20 mounted in one opening portion 10a can be the same as each other, or can be different from each other.

It is preferable that the height of the mountable semiconductor chip 20 is so set that the height of the first main surface 21a is the same as (or slightly less than) the surface 14a of the first insulating film 14.

In other words, it is preferable that the depth of the opening portion 10a (i.e., the height from the bottom surface 10aa to the surface 14a of the first insulation film 14) is the same as or slightly less than the maximum thickness of the mountable semiconductor chip 20. With such an arrangement, a second insulation film can be made flat easier, as will be detailed later.

In selecting the mountable semiconductor chips 20, it is preferable to select the combination of the mountable semiconductor chips 20 having complementary functions, for example, a memory chip and a control chip that controls the memory chip.

The first and second semiconductor chips 20a and 20b are mounted in the opening portion 10a in such a manner that the side surfaces 21c of the semiconductor chips 20a and 20b are apart from the side surfaces 10ab of the opening portion 10a.

Since the side surfaces 21c of the mountable semiconductor chips 20a and 20b are apart from the side surfaces 10ab of the opening portion 10a, the mountable semiconductor chips 20 and the electric devices 11 formed on the frame-shaped semiconductor chip 10 can be apart from each other. Thus, it becomes possible to reduce the effect of the noise generated by the mountable semiconductor chips 20*a* and 20*b*, and thereby to stabilize the operations of the electric elements 11. As a result, the reliability of the package can be enhanced.

In this example, the mountable semiconductor chips 20 are separated from each other, with the result that it becomes possible to prevent the interference of the mountable semiconductor chips 20 with each other.

With such an arrangement, it becomes possible to package a plurality of semiconductor chips that have complementary functions but conventionally have difficulty in packaging in a single package of a laminated structure because of the noise or other reason.

The second insulation film 32 is formed on the first insulation film 14 and the first main surface 21*a* of the mountable semiconductor chips 20, and has a flat top surface 32*aa*.

The second insulation film 32 is filled in the opening portion 10*a*. Therefore, the gaps between the side surfaces 10*ab* of the opening portion 10*a* of the frame-shaped semiconductor chip 10 and the side surfaces 21*c* of the mountable semiconductor chips 20 are filled with the second insulation film 32. The gaps filled with the second insulation film 32 are referred to as filled portions 32*a*.

The second insulation film 32 is formed on the surface 14*a* of the first insulation film 14 and the first main surfaces 21*a* of the mountable semiconductor chips 20 in such a manner that the first and second electrode pads 12*a* and 22 are exposed at the second insulation film 32.

The material of the second insulation film 32 is preferably selected from, for example, a polymer resin such as polyimide, poly-benzo-cyclobutene, poly-benz-oxazole or epoxy.

The mountable semiconductor chips 20 are fixed in the opening portion 10*a* by the second insulation film 32.

A first wiring layer 34 is formed on the second insulation film 32. The first wiring layer 34 includes a plurality of first wiring portions 34*a*.

A plurality of first wiring portions 34*a* extend on the second insulation film 32. The first wiring portions 34*a* include both of "fan-in" and "fan-out" structures with respect to the mountable semiconductor chips 20. Each of the first wiring portions 34 is electrically connected to one or both of the first and second electrode pads 12*a* and 22.

The first wiring layer 34 is preferably composed of metal wires such as gold (Au), silver (Ag), copper (Cu), aluminum (Al) or the like.

It is preferable that the second insulation 32 has the flat top surface 32*a*, with the result that the first wiring layer 34 can be easily formed thereon.

External terminals (i.e., first external terminals) 50 are connected to predetermined first wiring portions 34*a* among the plurality of the first wiring portions 34*a*. The external terminals 50 can be disposed on arbitrary and suitable positions in consideration of the mounting of the semiconductor device 100 on the mounting board. The external terminals 50 are arranged, for example, in a matrix at constant intervals. In this example, the plurality of external terminals 50 are arranged above the opening portion 10*a* and the frame portion 10*b*.

In this example, the external terminals 50 include electrode posts 52 electrically connected to the first wiring portions 34*a* and solder balls 54 connected to top surfaces 52*a* of the electrode posts 52. The electrode posts 52 are, for example, made of cupper and in the shape of cylindrical column.

A first sealing portion 40 is formed on the second insulation film 32, and covers the first wiring layer 34 so that external terminals 50 are exposed at the first sealing portion 40. In this example, the first sealing portion 40 is so formed that top surfaces 52*a* of the electrode posts 52 are exposed. The solder balls 54 are electrically connected to the top surfaces 52*a* of the electrode posts 52, and constitute the external terminals 50.

With such a structure of the semiconductor device, the mountable semiconductor chips 20 can be mounted in the opening portion 10*a* of the frame-shaped semiconductor chip 10 in such a manner that the mountable semiconductor chips 20 are apart from the side surfaces 10*ab* of the opening portion 10*a*. Therefore, it is possible to prevent the failure (for example, false operation of the electric devices 11) caused by the noise generated by the mountable semiconductor chips 20.

Moreover, since the electric devices 11 can be incorporated in the package, it is not necessary to form the electric devices 11 on the mounting board. Thus, it becomes possible to increase the mounting density of the semiconductor devices 100 on the mounting board.

Additionally, since the external terminals 50 can be formed on the frame portion 10*b* of the frame-shaped semiconductor chip 10, it becomes possible to increase the freedom in designing the intervals and positions of the external terminals 50 of the package.

Furthermore, the external terminals 50, the electric elements 11 and mountable semiconductor chips 20 can be connected by wires with short length. Therefore, the electric characteristics of the package can be enhanced, and the operating speed of the package can be enhanced.

(2) Operation of Semiconductor Device (SIP)

The example of the operation of the semiconductor device 100 (SIP) will be briefly described with reference to FIGS. 4A and 4B. In this example, the semiconductor device 100 is mounted in such a manner that the external terminals 50 are connected to electrode pads of a not-shown mounting board.

For example, a signal A is inputted to the semiconductor device 100 from the mounting board (i.e., the external device). The signal A is inputted to the electric element 11 via the external terminal 50 and the first wiring portion 34*a*. The electric element 11 performs a predetermined operation according to the signal A, and outputs the signal B. The signal B is inputted to the first mountable semiconductor chip 20*a* via the first wiring portion 34*a*. The first mountable semiconductor chip 20*a* performs a predetermined operation according to the signal B, and outputs the signal C. The signal C is inputted to the second mountable semiconductor chip 20*b* via the first wiring portion 34*a*. The second mountable semiconductor chip 20*b* performs a predetermined operation according to the signal C, and outputs the signal D. The signal D is outputted to the mounting board via the first wiring portion 34*a* and the external terminal 50.

As described above, the external terminals 50 and the first wiring layer 34 are used for transferring the signals between the mounting board, the electric elements 11 of the frame-shaped semiconductor chip 10, and the first and second mountable semiconductor chips 20*a* and 20*b*.

(3) Manufacturing Method of Semiconductor Device (SIP)

Figure 5A:
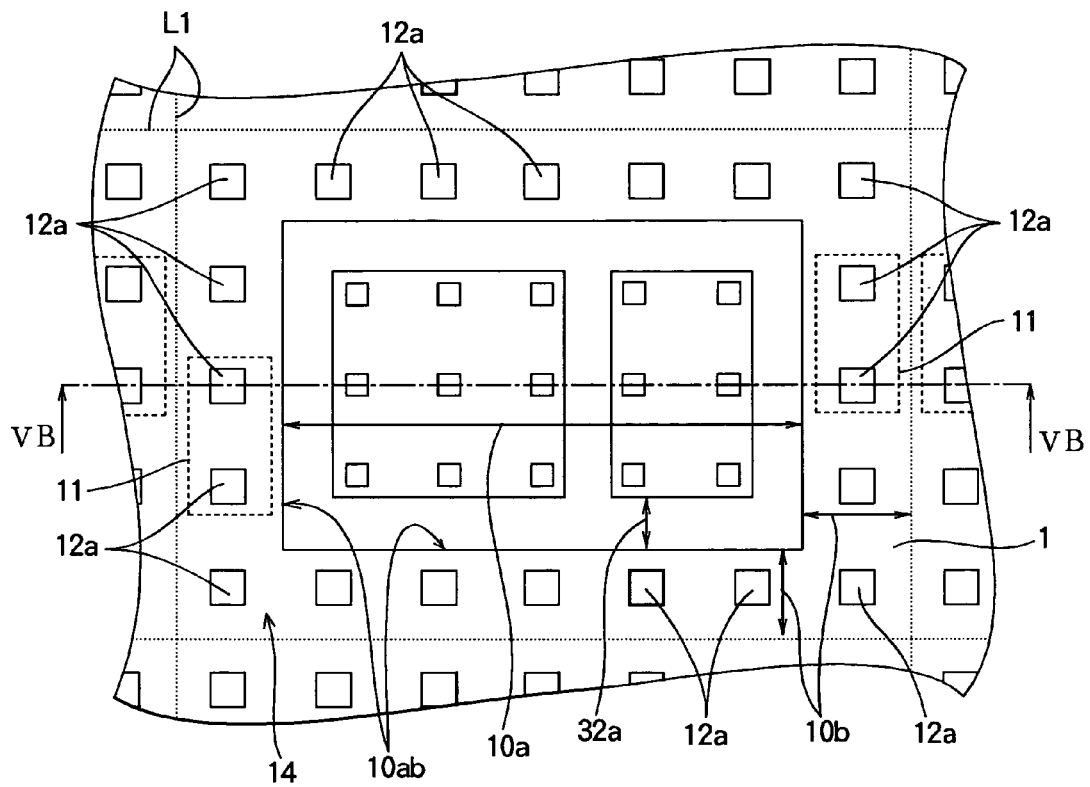
FIG. 5A is a schematic plan view illustrating the manufacturing process of the semiconductor device of the SIP structure.
Figure 5B:
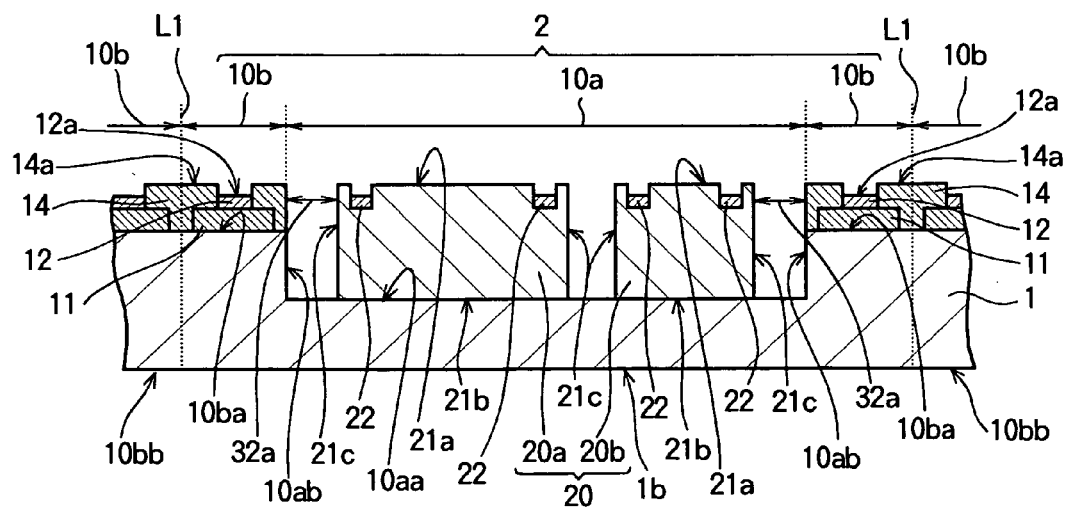
FIG. 5B is a schematic sectional view taken along Line VB-VB in FIG. 5A.

The manufacturing method of the semiconductor device 100 (SIP) according to the second embodiment will be described with reference to FIGS. 5A through 7C. FIG. 5A is a schematic plan view of the semiconductor device in the manufacturing process. FIG. 5B is a schematic sectional view taken along Line VB-VB in FIG. 5A.

Figure 6A:
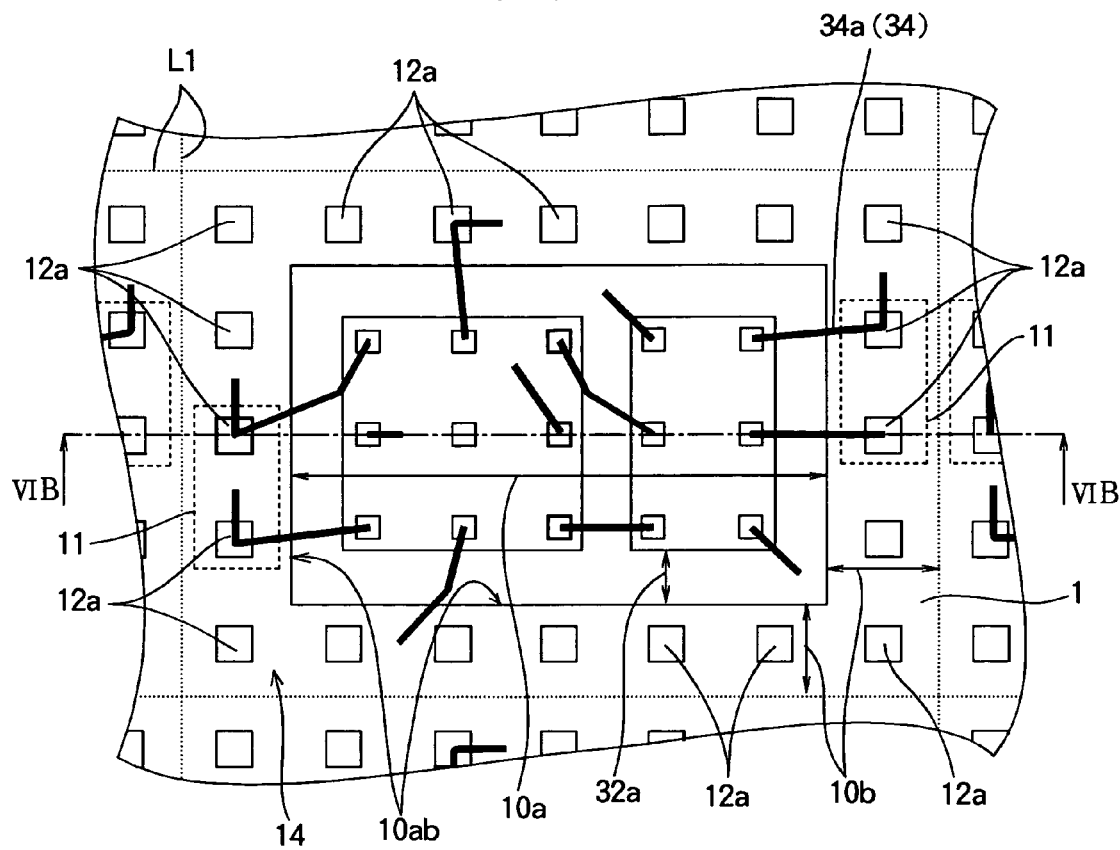
FIGS. 6A and 6B are a schematic plan view and a schematic sectional view illustrating the manufacturing process following the step of FIG. 5C, FIGS. 7A through 7C are schematic sectional views illustrating the manufacturing process following the step of FIG. 6.
Figure 6B:
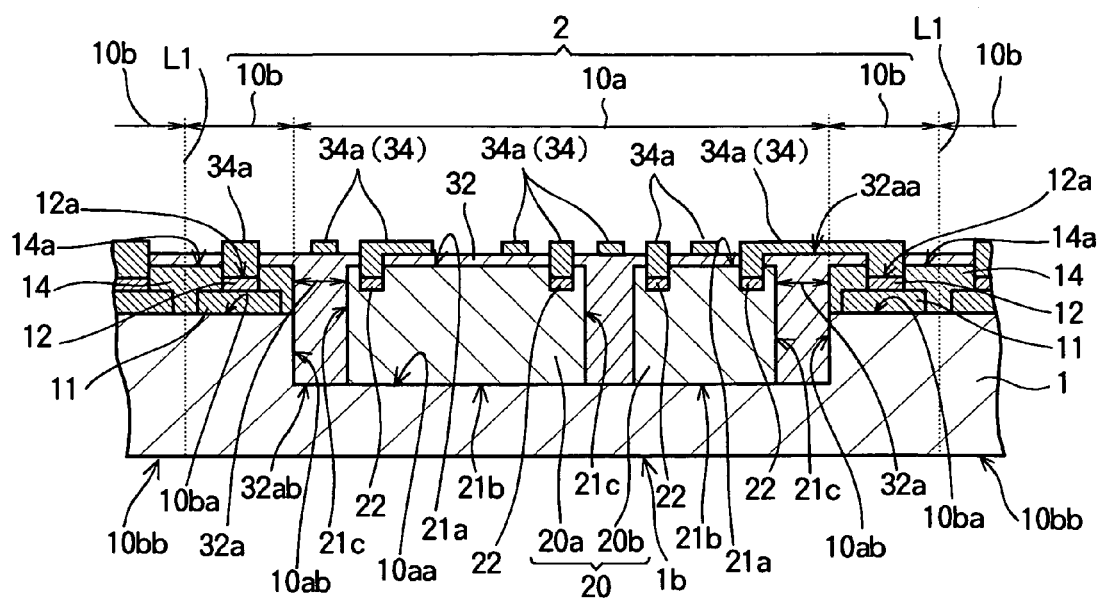

FIGS. 6A and 6B are a schematic plan view and a schematic sectional view taken along Line VB-VB in FIG. 5A, illustrating the manufacturing process following the step of FIG. 5C.

Figure 7A:
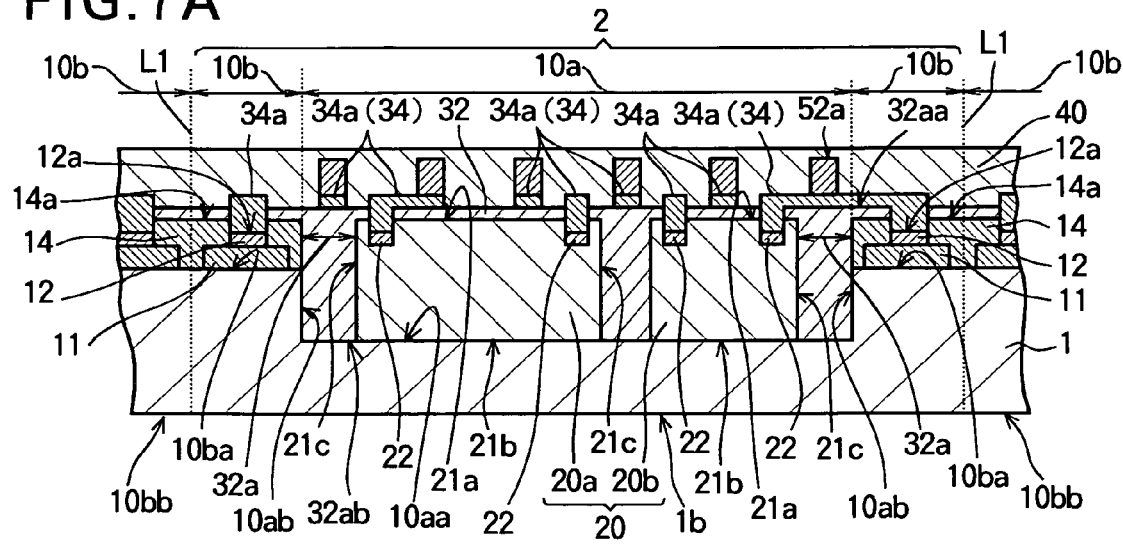
Figure 7B:
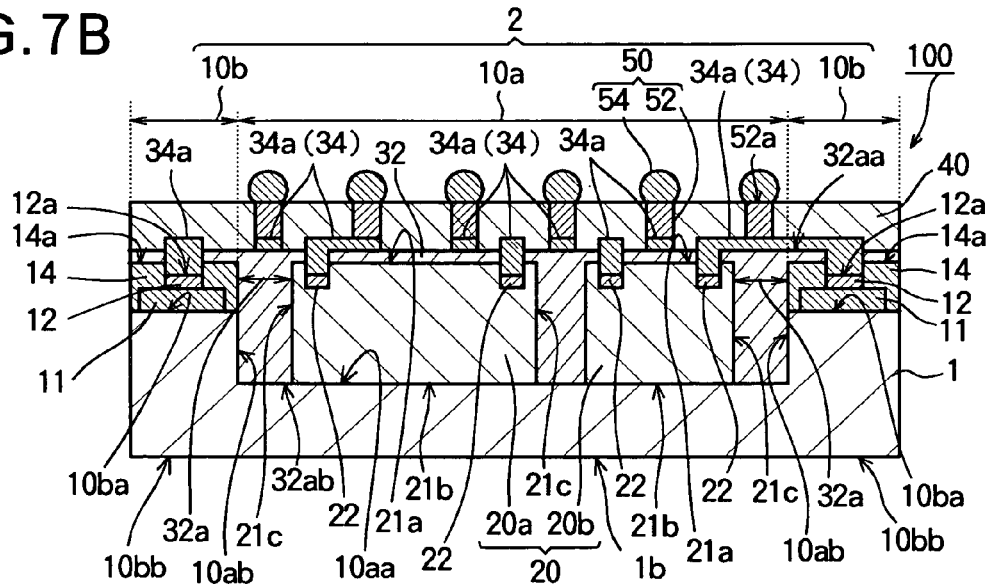
Figure 7C:
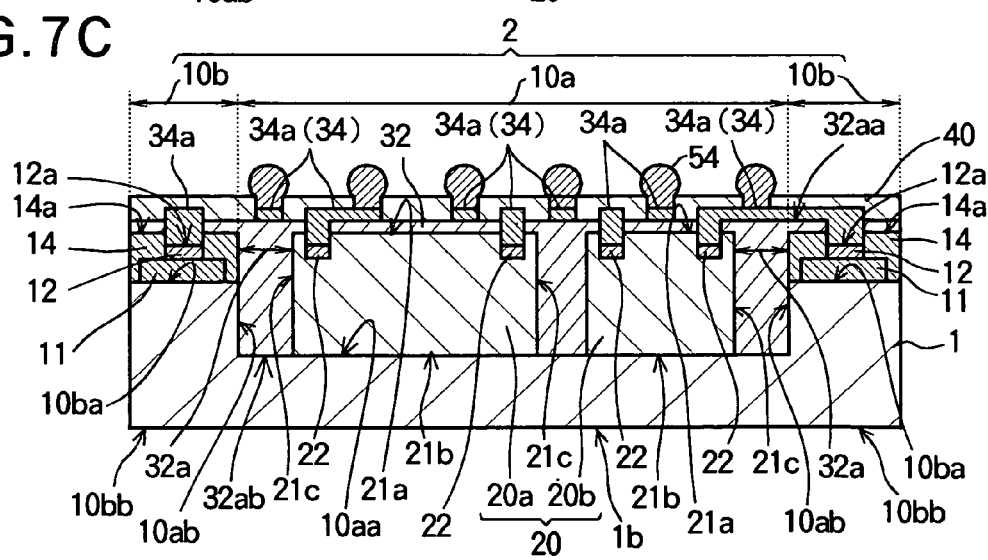

FIGS. 7A through 7C are schematic sectional views taken along Line VB-VB in FIG. 5A, illustrating the manufacturing process following the step of FIG. 6B.

As shown in FIGS. 5A and 5B, the semiconductor chip 1 on which a plurality of the frame-shaped semiconductor chips 10 (described with reference to FIG. 1) are arranged in a matrix is prepared.

Then, a plurality of (and if needed, different kind of) mountable semiconductor chips 20 to be mounted on the frame-shaped semiconductor chips 10 are prepared.

Each of the mountable semiconductor chips 20 includes the first main surface 21a at which a plurality of the second electrode pads 22 are exposed, the second main surface 21b opposite to the first main surface 21a, and the side surfaces 21c between the first and second main surfaces 21a and 21b.

A predetermined number of, and at least one of mountable semiconductor chip 20 is mounted in each opening portion 10a of the semiconductor substrate 1.

To be more specific, the mountable semiconductor chips 20 are fixed in the opening portions 10a by means of conventional dice-bonding or the like, in such a manner that the second main surfaces 21b of the mountable semiconductor chips 20 face the bottom surface 10aa of the opening portion 10a and the side surfaces 21c of the mountable semiconductor chips 20 are apart from the side surfaces 10ab of the opening portion 10a. The distances between the side surfaces 21c of the mountable semiconductor chips 20 and the side surfaces 10ab of the openings 10a are so set that the mountable semiconductor chips 20 and the electric elements 11 on the frame-shaped semiconductor chip 10 can operate correctly without impairing the electric characteristics of each other.

Additionally, the distances between the adjacent mountable semiconductor chips 20 are so set that the mountable semiconductor chips 20 can operate correctly without impairing the electric characteristics of each other.

Then, as shown in FIGS. 6A and 6B, the second insulation film 32 is formed on the first insulation layer 14 and the first main surface 21a.

To be more specific, a film of the above described organic insulation material is formed by means of a conventional method, and preferably by means of a spin coating method, a printing method or a direct coating method or the like. Then, the film is patterned by means of, for example, a photolithography process and an etching process according to a conventional process, so as to obtain a patterned film at which the parts of the first and second electrode pads 12a and 22 are exposed.

In the forming step of the second insulation film 32, the second insulation film 32 is also filled in the opening portion 10a in which the mountable semiconductor chips 20 are mounted, so that filled portions 32a are formed.

The top surface 32aa of the second insulation film 32 is preferably flat. For example, if there is a difference in height among the plurality of the semiconductor chips 20 in the opening portion 10a, or if there is a difference in height between the semiconductor chips 20 and the frame portion 10b, it is preferable to flatten the top surface 32aa of the second insulation film 32 in this forming step of the second insulation film 32.

It is possible that the forming step of the second insulation film 32 includes a first step forming the filled portions 32a, a second step flattening the top surface 32aa extending above the filled portion 32a, the first insulation film 14 and the first primary surface 21a.

With such a process, the top surface 32aa of the second insulation film 32 can easily be flattened. Therefore, it becomes possible to correctly perform the posterior process (in particular, the forming step of the wiring layer) without causing the problem such as disconnection of wires, and therefore the reliability of the semiconductor device can be enhanced.

Next, the first wiring layer 34 is formed to extend on the second insulation film 32. The first wiring layer 34 is formed as wiring patterns including a plurality of first wiring portions 34a extending on the second insulation film 32.

The first wiring layer 34 can be formed in accordance with an applicable wiring process rule, and the width, intervals and suitable angles of the wirings are so determined that the wiring lengths can be minimized. I The first wiring portions 34a are so formed that at least one end of each first wiring portion 34a is connected to one of the first and second electrode pads 12a and 22. The first wiring portions 34a also include wiring portions that connect the first electrode pads 12a and the second electrode pads 22.

The first wiring layer 34 can be made of the above described material by means of a forming process of wiring patterns (for example, a spattering process and a photolithography process) used in a manufacturing process of a conventional wafer level chip size package (referred to as W-SCP).

Then, a plurality of external terminals 50 are formed so that each external terminal 50 is electrically connected to the other end of the first wiring portion 34a (i.e., the end which is not connected to either of the first and second electrode pads 12a and 22).

In this example, as was described above, the external terminals 50 are constituted by the electrode posts 52 and the solder balls 54 mounted on the top surfaces 52a of the electrode posts 52. First, the electrode posts 52 are formed on the other ends of the first wiring portions 34a (i.e., the ends which are not connected to either of the first and the second electrode pads 12a and 22).

The electrode posts 52 are formed at predetermined intervals determined in consideration of the mounting of the semiconductor device 100 on the mounting board. The intervals can be constant interval, or irregular intervals.

The forming process of the electrode posts 52 can be performed by a forming process of electrode posts (for example, a plating process and a photolithography process) used in a manufacturing process of the conventional W-SCP.

Next, the first sealing portion 40 is formed on the first wiring layer 34 and the second insulation film 32.

The first sealing portion 40 is so formed that the external electrodes 50 (in this example, the top surfaces 52 of the electrode posts 52) are exposed at the first sealing portion 40.

This sealing process can performed by a conventional method using a conventional sealing material.

As shown in FIG. 7A, the first sealing portion 40 is once formed to cover the top surfaces 52a of the electrode posts 52.

Then, as shown in FIG. 7B, the surface of the first sealing portion 40 is ground, so that the top surfaces 52a of the electrode posts 52 are exposed.

This process is performed using the conventional grinding or polishing.

For example, the forming process of the first sealing portion 40 can be performed by a film forming method. In this case, it is possible to directly form the first sealing portion 40 so that the top surfaces 52a of the electrode posts 52 are exposed at the first sealing portion 40.

It is also possible to perform an arbitrary and suitable process which is necessary in certain designs of the top surfaces 52a of the electrode posts 52. For example, if the electrode posts 52 are made of cupper, it is possible to form the nickel (Ni) film and gold (Au) film on the top surfaces 52a of the electrode posts 52.

Then, the solder balls 54 are formed on the top surfaces 52*a* of the electrode posts 52 exposed at the first sealing portion 40, so that the external terminals 50 are formed.

The external terminals 50 can take an arbitrary and suitable form (such as planar lands, projecting electrodes projecting from the first wiring portion 34*a*, or the like) As shown in FIG. 7C, the external terminals 50 can be formed as, for example, planar lands without electrode posts. The external terminals 50 as planar lands can be formed by an arbitrary and suitable process, for example, by partially exposing the first wiring portions 34 and applying solder paste to the exposed surface. In this example, the solder balls 54 are connected to the planar lands.

Finally, the semiconductor substrate 1 is cut along the scrub line L1, so that the respective chip areas 2 are separated from each other. Each chip area 2 becomes a single semiconductor device 100 that performs a predetermined function.

In the separating process, it is preferable to cut the semiconductor substrate 1 by means of a conventional dicing device having a rotating blade that rotates in high speed.

In the above manufacturing method, the manufacturing process of W-CSP can be applied, and therefore the semiconductor device of the embodiment can be manufactured in an efficient and simple manner without using a special manufacturing process and a special manufacturing device needed in the special manufacturing process.

Third Embodiment

The third embodiment of the present invention will be described with reference to FIG. 8. The third embodiment is different from the second embodiment in structure of the semiconductor device (SIP). In the third embodiment, a lower base having functionality is formed on the lower side of the package.

In the third embodiment, the components formed on the upper side of the semiconductor substrate 1 (i.e., the electric devices 11, the wiring layer 34, the insulation films 14 and 32, the sealing portion 40 and the external terminals 50) are the same as those of the second embodiment. Therefore, the components that are the same as those of the second embodiment are assigned the same reference numerals, and the explanation thereof is omitted.

Figure 8:
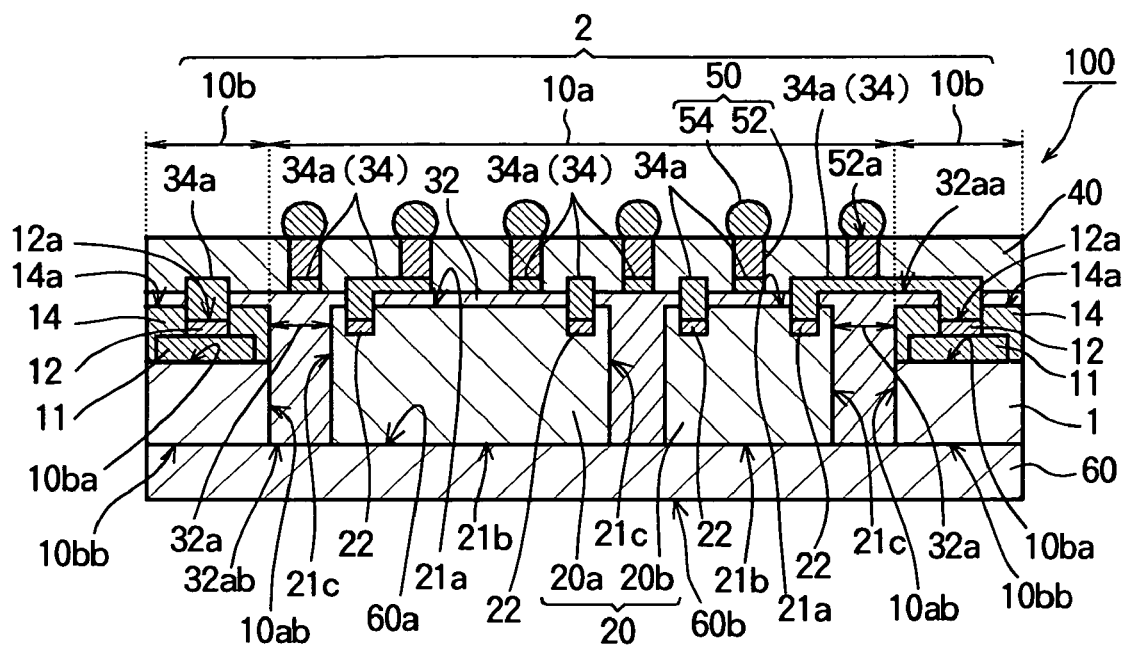
FIG. 8 is a schematic sectional view of the semiconductor device taken along a line corresponding to Line IVB-IVB in FIG. 4A.

FIG. 8 is a schematic sectional view of the semiconductor device cut along a line corresponding to Line IVB-IVB in FIG. 4A.

In this example, the semiconductor device 100 has a lower base 60 formed on the bottom side thereof. To be more specific, the lower base 60 is bonded to the second main surfaces 21*b* of the first and second semiconductor chips 20*a* and 20*b* and the bottom surface 10*bb* of the frame portion 10*b*.

The lower base 60 is made of a thin plate member having a top surface 60*a* and a bottom surface 60*b* opposite to the top surface 60*a*.

The lower base 60 can be composed of, for example, a plate or sheet made of glass epoxy or organic material such as polyimide. Alternatively, the lower base 60 can be composed of a thin plate made of a material suitably selected from ceramic, metal, Si (silicon) or the like.

The lower base 60 is preferably made of a thin plate member having a functionality. The lower base 60 is preferably made of a thin plate member which is excellent in, for example, light shielding property, heat radiation property or rigidity.

In order to impart a light shielding property to the lower base 60, it is possible to use a thin plate member made of epoxy resin containing carbon black.

If the lower base 60 is made of a thin plate member having a light shielding property, it becomes possible to package a chip that needs to be shielded from the light in a packaging process, for example, a chip manufactured by a Silicon-On-Sapphire (SOS) process.

In order to impart a heat radiation property to the lower base 60, the lower base 60 can be composed of a thin plate member made of a material having high heat radiation such as a ceramic plate, a metal plate (for example, aluminum plate) or the like. Such a thin plate member preferably has a structure such as a fin or the like (as in the conventional heat sink) for increasing a surface area of the lower base 60 to thereby enhance the heat radiation property.

In order to prevent electromagnetic interference (EMI), it is possible to impart a shielding property of radiation noise to the lower base 60. In such a case, the lower base 60 can be composed of a thin plate member made of, for example, a conventional electromagnetic shield resin, a conventional electromagnetic shield plating or the like.

If the lower base 60 is made of a thin plate member having high rigidity, it becomes possible to effectively protect the mountable semiconductor chips 20 in the package from the externally applied stress.

Further, if the lower base 60 is directly provided on the bottom side of the mountable semiconductor chips 20, it becomes possible to obtain a thinner semiconductor device.

Additionally, if the lower base 60 is made of the above described thin plate member capable of performing a predetermined function, it becomes possible to widen the range of the selection of the mountable semiconductor chips 20 to be packaged. Therefore, it becomes possible to enhance the function and value of the semiconductor device 100.

The operation of the semiconductor device 100 of this embodiment is the same as that of the second embodiment, and therefore the explanation thereof is omitted.

(2) Manufacturing Method of Semiconductor Device (SIP)

The manufacturing method of the semiconductor device 100 (SIP) according to the third embodiment will be described with reference to FIGS. 9A through 9C.

FIGS. 9A through 9C are schematic sectional views of the semiconductor device 100 in the manufacturing process taken along a line corresponding to Line IVB-IVB in FIG. 4A. The conditions of the steps shown in FIGS. 9A through 9C (except the condition that will be explained below) are the same as those described in the second embodiment, and the duplicate explanation is omitted.

The forming step of the first sealing portion 40 and its previous steps are performed in the same way as those described in the second embodiment with reference to FIG. 7A.

Then, as shown in FIG. 9A, the surface of the first sealing portion 40 is ground, so that the external terminals 50 (in this example, the top surfaces 52*a* of a plurality of the electrode posts 52) are exposed.

Next, as shown in FIG. 9B, the entire bottom surface 1*b* of the semiconductor substrate 1 is ground until at least the second main surfaces 21*b* of the mountable semiconductor chips 20 are exposed. In this step, the bottom surface 10*bb* of the frame member 10*b* and the second main surfaces 21*b* of the mountable semiconductor chips 20 are flattened into one plane.

If there is a room for further grinding the second main surface 21*b* sides of the mountable semiconductor chips 20, it is possible to further grind the second main surface 21*b* sides, as long as the functions of the mountable semiconductor chips 20 are not impaired. With such a process, it becomes possible to obtain a thinner semiconductor device 100 (SIP).

Then, the surface 60a of the base layer 60 (i.e., a thin plate member having the above functionality) is preferably bonded to the entire bottom surface 1b of the semiconductor substrate 1 (in which a plurality of semiconductor devices 100 are being formed), i.e., a flat surface including the bottom surface 10bb of the frame portion 10b and the second main surfaces 21b of the mountable semiconductor chips 20. This bonding process can be performed by using an arbitrary, suitable and conventional dice-bonding material or the like.

Next, as shown in FIG. 9C, the solder balls 54 are fixed to the top surfaces 52a of the electrode posts 52 exposed at the surface of the first sealing portion 40, with the result that the external terminals 50 are formed.

Finally, the semiconductor substrate 1 is cut along the scrub lines L1 so that the respective chip areas 2 are separated from each other. Each chip area 2 becomes a single semiconductor device 100 that performs a predetermined function.

With such a manufacturing process, it becomes possible to efficiently manufacture the semiconductor device 100 having the lower base 60.

Fourth Embodiment

The fourth embodiment will be described with reference to FIGS. 10A through 11B. This embodiment relates to SIP having the structure in which the filled portion has through holes and embedded wirings embedded in the through holes.

In the semiconductor device of this embodiment, the components except the through holes and embedded wirings are the same as those of the second and third embodiments. Therefore, the components that are the same as those of the second and third embodiments are assigned the same reference numerals, and the explanation thereof is omitted.

(1) Structure of Semiconductor Device (SIP)

Figure 10A:
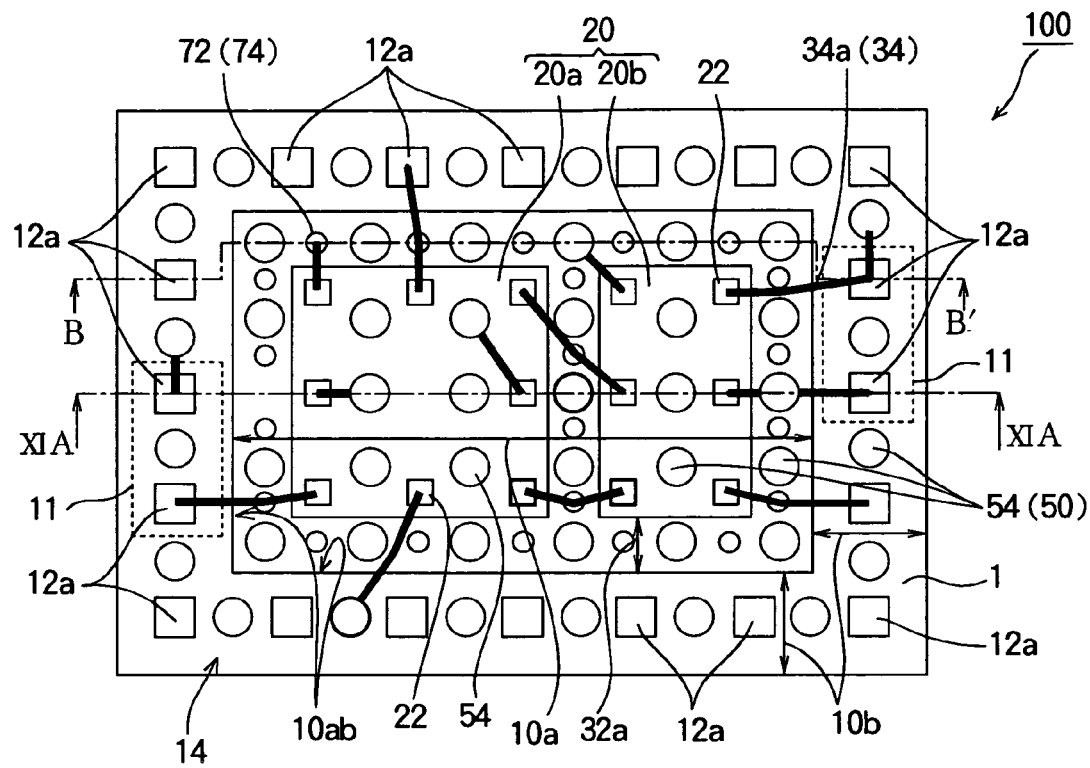
FIG. 10A is a schematic plan view illustrating the semiconductor device of the SIP structure.
Figure 10B:
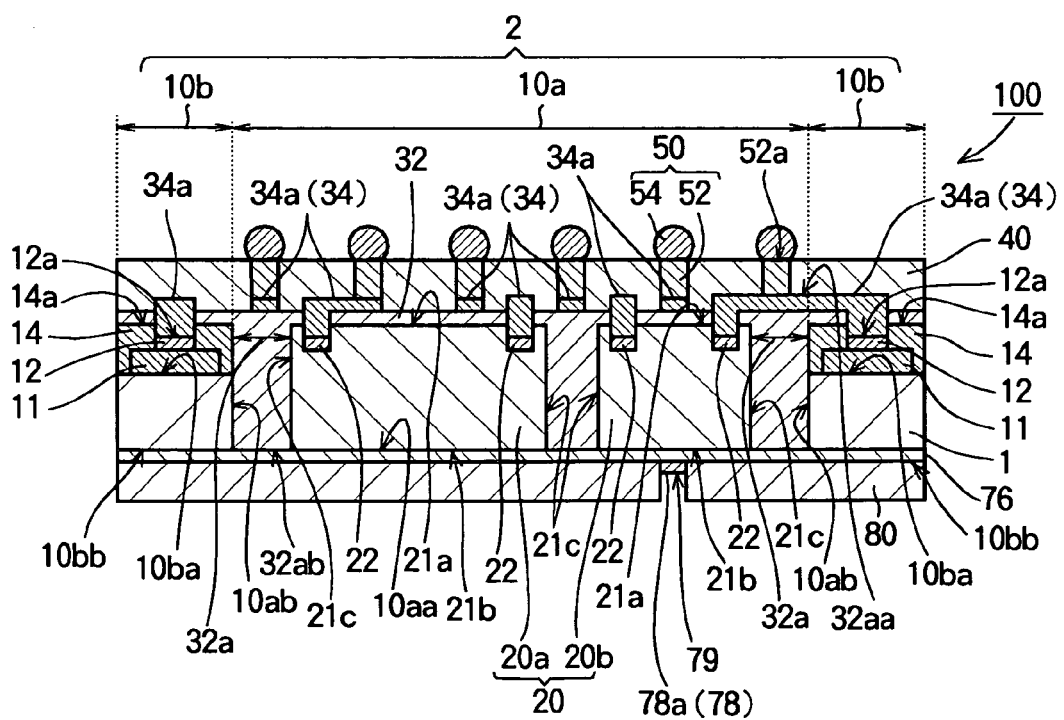
FIG. 10B is a schematic sectional view taken along Line XB-XB in FIG. 10A.

FIG. 10A is a schematic plan view illustrating the semiconductor device 100 (SIP). FIG. 10B is a schematic sectional view taken along Line XB-XB in FIG. 10A.

Figure 11A:
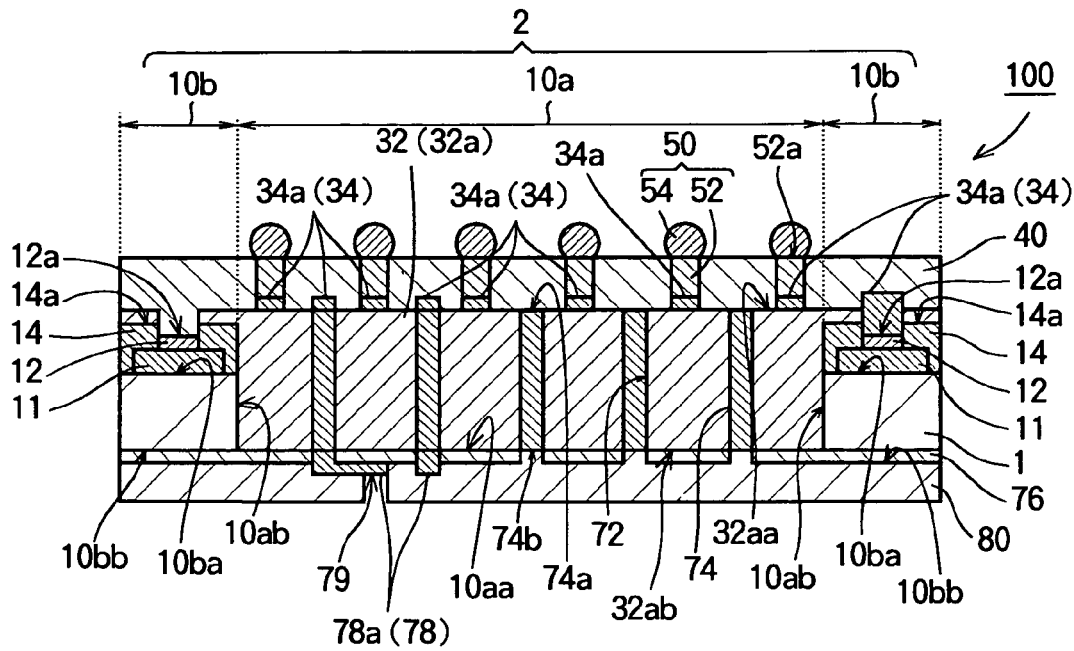
FIG. 11A is a schematic sectional view taken along Line XIA-XIA in FIG. 11B.
Figure 11B:
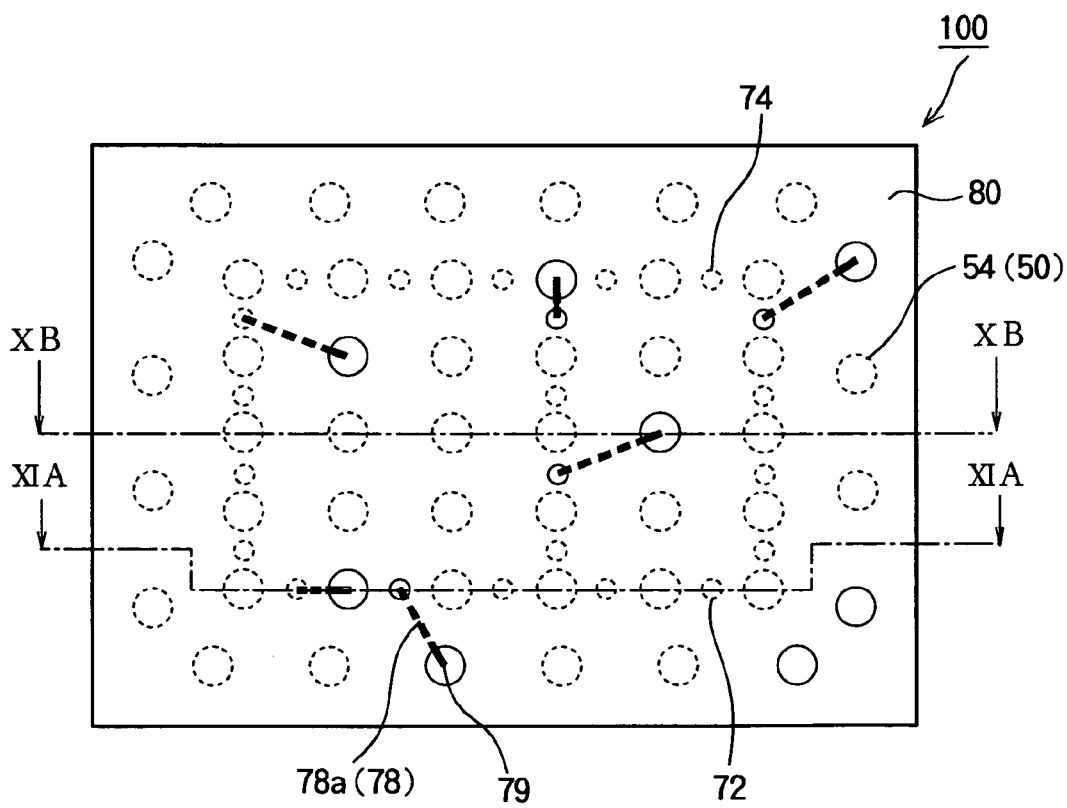
FIG. 11B is a schematic bottom view illustrating the semiconductor device of the SIP structure.

FIG. 11A is a schematic sectional view taken along Line XB-XB in FIG. 11B. FIG. 11B is a schematic bottom view schematically illustrating the semiconductor device 100 (SIP) as seen from below.

As shown in FIGS. 10A and 11A, the semiconductor device according to the embodiment has a plurality of through holes 72. The through holes 72 are formed on the filled portions 32a, and reach bottom surfaces 32ab of the filled portions 32a from top surfaces 32aa.

The through holes 72 are disposed on gaps between the frame-shaped semiconductor chip 10 and the mountable semiconductor chips 20, and gaps between the adjacent mountable semiconductor chips 20 (in the case where a plurality of mountable semiconductor chips 20 are mounted in the opening 10a). The through holes 72 are arranged around the mountable semiconductor chips 20 at constant intervals.

The through holes 72 are filled with an electric conductive material such as aluminum, tungsten or the like, so that embedded wiring portions 74 are formed. The embedded wiring portions 74 penetrate the filled portion 32a. The top and bottom ends of the embedded wiring portions 74 are respectively exposed at the top surface 32aa and the bottom surface 32ab of the filled portion 32a. The exposed surface of each embedded wiring portion 74 at the top surface 32aa is referred to as "a top surface 74a" and may also referred to simply as "one end". The exposed surface of each embedded wiring portion 74 at the bottom surface 32ab is referred to as "a bottom surface 74b" and may also referred to simply as "the other end".

The first wiring portions 34a of the first wiring layer 34 are connected to the top surfaces 74a. In other words, the embedded wiring portion 74 is connected via the first wiring layer 34 to one of the first electrode pads 22 of the mountable semiconductor chips 20, the electrode terminals 12 of the electric elements 11, the top surfaces 74a of other embedded wirings 74 (formed in other through holes 72) and the external terminals 50.

A third insulation film 76 is formed on the bottom surface of the semiconductor device 100, i.e., the bottom surface 10bb of the exposed frame portion 10a and the bottom surfaces 32ab of the filled portions 32a. The third insulation film 76 is formed to have a flat surface. As shown in FIG. 11A, the bottom surfaces 74b of the embedded wiring portions 74 are exposed at the third insulation film 76. The third insulation film 76 can be formed by, for example, the same material and the same method as those of the above described second insulation film 32.

Second wiring layer 78 is connected to the bottom ends 74b of the embedded wirings 74. The second wiring layer 78 includes a plurality of second wiring portions 78a extending on the third insulation film 76. The second wiring layer 78 can be formed by the same material and the same method as those of the above described first wiring layer 34.

Third electrode pads 79 are formed as parts of the predetermined second wiring portions 78a selected from the plurality of second wiring portions 78a. The third electrode pads 79 function as the external terminals (i.e., the second external terminals). The third electrode pads 79 can be disposed on arbitrary and suitable positions by suitably modifying the forms of the extending second wiring portions 78a. For example, if the third electrode pads 79 are composed of bonding pads (connected to the bonding wires), the bonding process can be simplified by arranging the third electrode pads 79 along the periphery of the semiconductor device 100 (i.e., the periphery of the chip areas 2). Further, the third electrode pads 79 can be arranged regularly, for example, in a matrix. In this example, the plurality of the third electrode pads 79 are disposed on positions arranged in a matrix and opposite to the positions of the external terminals 50. In FIG. 11B, the positions of the external terminals (i.e., the first external terminals) 50 are indicated by dash lines.

In this example, the third electrode pads 79 are planar electrodes composed of the exposed ends of the second wiring portions 78a. Since the third electrode pads 79 function as the external terminals, the third electrode pads 79 are not limited to the planer shape, but can be in various kinds of shapes such as a ball grid array including projecting electrodes (for example, solder balls) or the like.

A second sealing portion 80 is formed on the third insulation film 76. The second sealing portion 80 covers the second wiring layer 78 so that the third electrode pads 79 as the external terminals (i.e., the second external terminals) are exposed. In this example, parts of the second wiring portions 78a of the second wiring layer 78 are exposed as the third electrode pads 79. The second sealing portion 80 can be formed by the same material and same method as the those of the first sealing portion 40.

The second wiring layer 78 is connected via the embedded wiring portions 74 to one of the first electrode pads 22 of the mountable semiconductor chips 20, the electrode pads 12a of the electric elements 11 and the external terminals 50.

Since the through holes 72 and the embedded wiring portions 74 are provided, the electric connections between the electric elements 11 on the frame portion 10b and the mountable semiconductor chips 20 can be established at the second main surface 21b side of the mountable semiconductor chips 20. Therefore, even in a state where the external terminals 50 are connected to the mounting board, it is possible to electrically access the electric elements 11 and the mountable semiconductor chips 20. Therefore, the flexibility in mounting the semiconductor device 100 increases. For example, in addition to the connection using the external terminals 50, it is possible to perform wire bonding (not shown) using the third electrode pads 79.

With such an arrangement, a plurality of semiconductor devices 100 can be mounted in a three dimensional structure as detailed below, so that a further multifunctional package can be obtained.

The embedded wiring portions 74 are formed on the filled portions 32a disposed around the mountable semiconductor chips 20, and therefore the wiring length of the first wiring portions 34a connecting the embedded wiring portion 74 and the second electrode pads 22 can be short. Thus, the electric characteristics of the semiconductor device 100 can be enhanced, without having an adverse effect on the mountable semiconductor chips 20. Therefore, the operating speed of the semiconductor device 100 can be enhanced.

(2) Manufacturing Method of Semiconductor Device (SIP)

The manufacturing method of the semiconductor device 100 (SIP) of the fourth embodiment will be described with reference to FIGS. 12A through 13B.

Figure 12A:
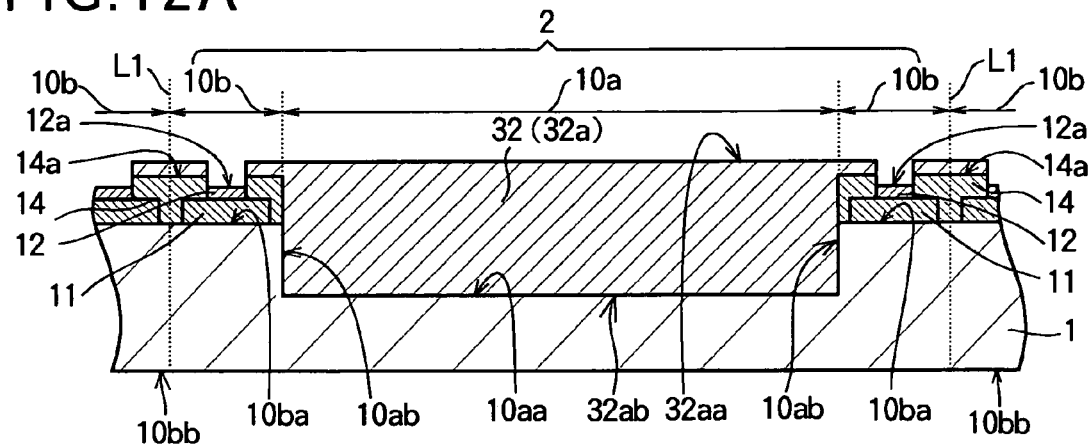
FIGS. 12A through 12C are schematic sectional views of the semiconductor device in the manufacturing process taken along a line corresponding to Line XII-XII in FIGS. 10A and 11B.
Figure 12B:
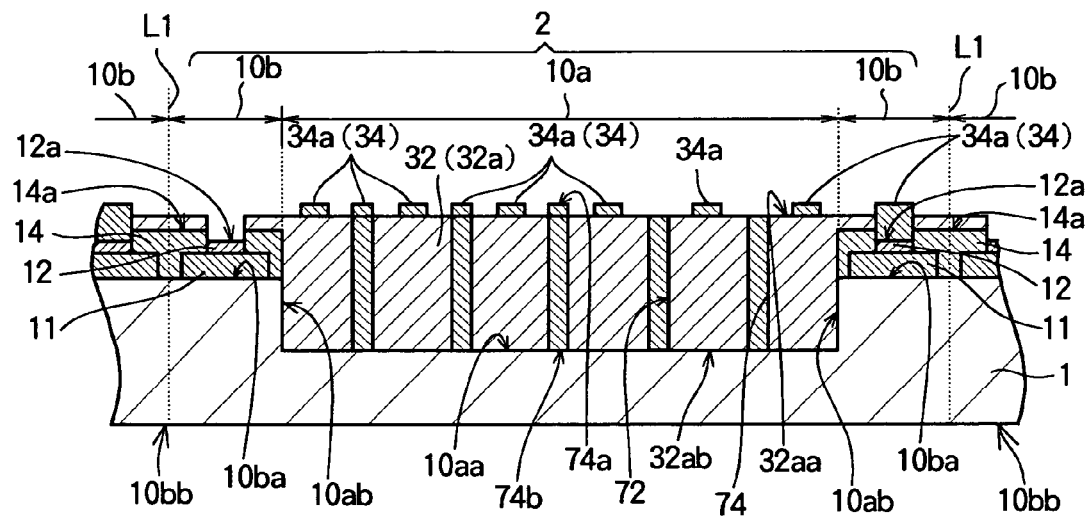
Figure 12C:
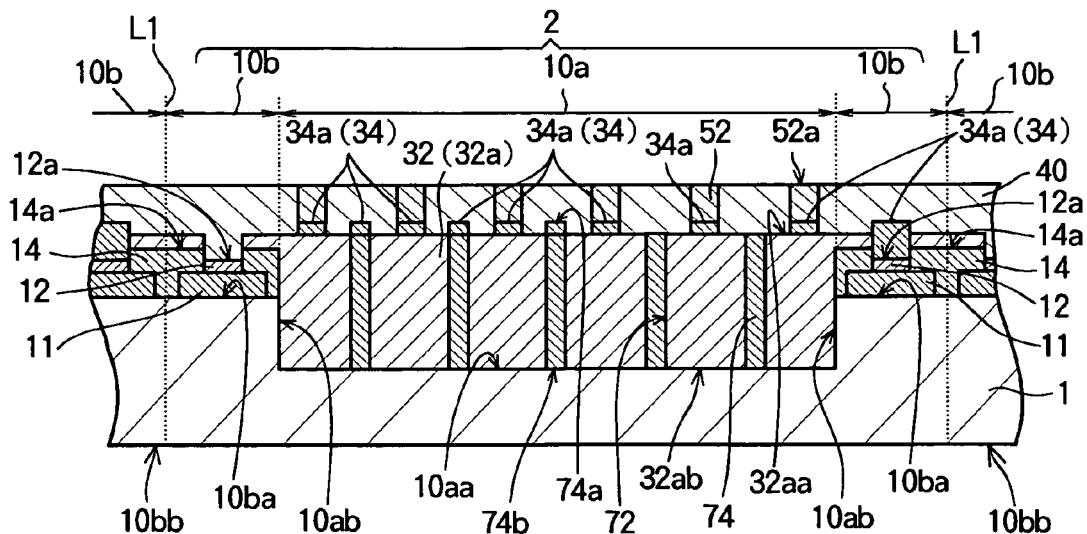

FIGS. 12A through 12C are schematic sectional views of the semiconductor device in the manufacturing process taken along a line corresponding to Line XIA-XIA in FIGS. 10A and 11B.

Figure 13A:
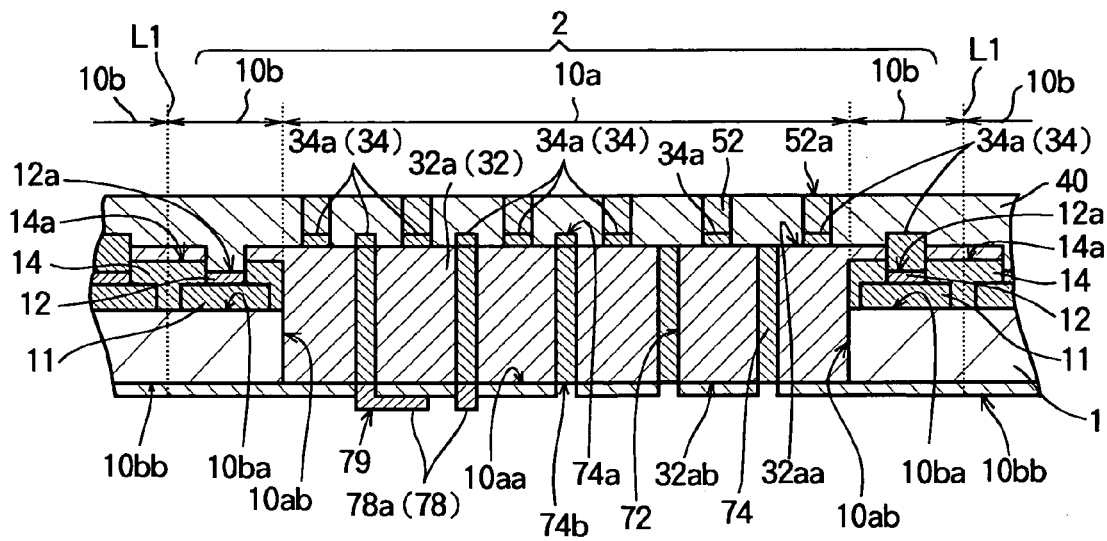
FIGS. 13A and 13B are schematic sectional views of the manufacturing process following the step of FIG. 12C.
Figure 13B:
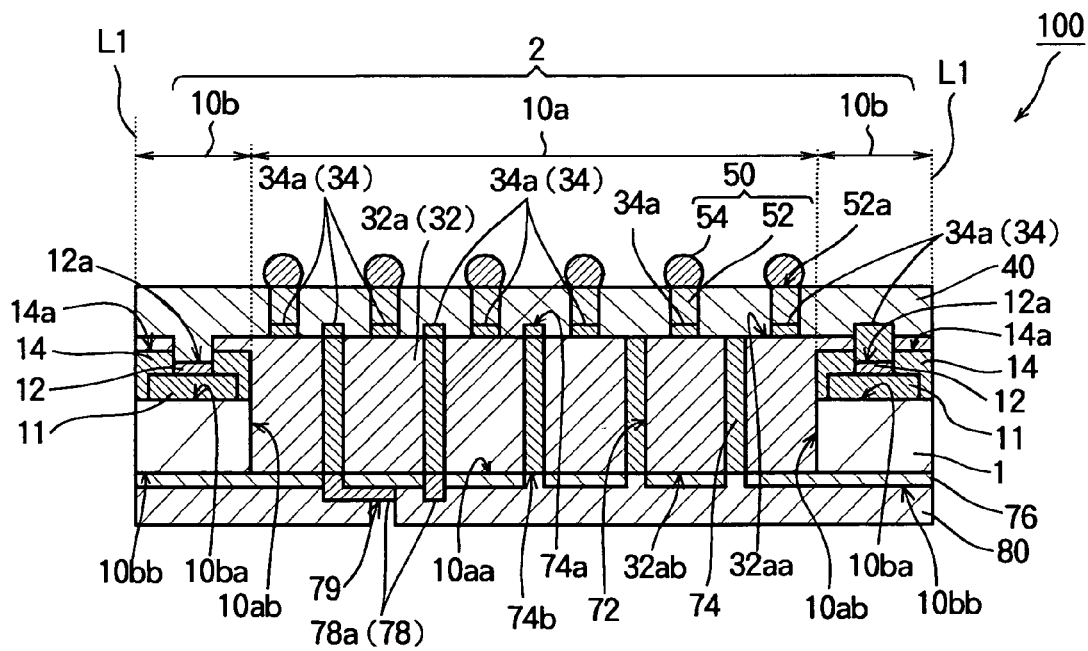

FIGS. 13A and 13B are schematic sectional views of the manufacturing process following the step of FIG. 12C. The conditions of the steps shown in FIGS. 12A through 12C (except the condition that will be described below) are the same as the those described in the second and third embodiments, and the duplicate explanation is omitted.

As was described with reference to FIG. 6A, the second insulation film 32 is formed on the first insulation film 14 and the first main surface 21a of the mountable semiconductor devices 20. Further, as shown in FIG. 12A, the second insulation film 14 is filled in the opening portion 10a, so as to form filled portions 32a.

Then, a plurality of through holes 72 are formed as shown in FIG. 12B. The through holes 72 are so formed that the through holes 72 reach the bottom surface 10aa of the opening portion 10a from the top surface 32aa of the filled portion 32a.

The through holes 72 can be made of a conventional process such as a photolithographic process and an etching process, or a drilling process (using a laser drill or the like).

The through holes 72 are formed in the filled portion 32a of the above described organic insulation material. Therefore, the through holes 72 can be formed in easier manner and in higher accuracy than a general process forming the through holes on a silicon substrate in a conventional manufacturing process of the SIP.

The through holes 72 are formed to have diameters of approximately 20 μm in the general example. In the mounting process of the mountable semiconductor chips 20 on the frame-shaped semiconductor chip 10, the diameters of the through holes 72 to be formed on the posterior process are taken into consideration. If the diameter of the through hole 72 is approximately 20 μm, the gap between the side surface 21c of the mountable semiconductor chip 20 and the side surface 10ab of the opening portion 10a, and the gap between the adjacent mountable semiconductor chips 20 (i.e., the width of the filled portion 32a) can be approximately 60 μm.

Then, the through holes 72 are filled with the electric conductive material, so that the embedded wiring portions 74 are formed.

Next, as was described above, the first wiring layer 34 is formed on the second insulation film 32. The first wiring layer 34 is formed of wiring patterns including the plurality of first wiring portions 34a extending on the second insulation film 32.

At least one end of each first wiring portion 34a is connected to one of the first and second electrode pads 12a and 22 and the top surface 74a of the embedded wiring portions 74. The first wiring portions 34a include wiring portions connecting the first electrode pads 12a and the second electrode pads 22.

Then, as was described in the second embodiment, electrode posts 52 are formed in such a manner that the electrode posts 52 are connected to the other ends (i.e., ends which are not connected to either of the first and second electrode pads 12a and 22) of the first wiring portions 34a.

Next, the first sealing portion 40 is formed on the first insulation layer 34 and the second insulation film 32 as shown in FIG. 12C.

Then, the first sealing portion 40 is ground so that the external terminals 50 (in this example, the top surfaces 52a of the electrode posts 52) are exposed at the first sealing portion 40.

Next, the as shown in FIG. 13A, the entire surface of the bottom surface 1b of the semiconductor substrate 1 is ground at least until the second main surfaces 21b of the mountable semiconductor chips 20 are exposed. In this step, the bottom surface 10bb of the frame portion 10b, the second main surfaces 21b of the mountable semiconductor chips 20 and the bottom surfaces 74b of the embedded wiring portions 74 are exposed and flattened into one plane.

Then, the third insulation film 76 is formed in such a manner that at least parts of the bottom surfaces 74b of the embedded wiring portions 74 are exposed at the third insulation film 76.

Next, the second wiring layer 78 is formed on the third insulation film 76. The second wiring layer 78 is formed to have a plurality of second wiring portions 78a. An end of each second wiring portion 78a is connected to the bottom surface 74b of the embedded wiring portion 74.

Then, as shown in FIG. 13B, the second sealing portion 80 is formed in such a manner that the other end of each second wiring portion 78a is exposed.

The second sealing portion 80 is formed on the third insulation film 76 and covers the second wiring layer 78 so that third electrode pads 79 are exposed. In this example, parts of the second wiring portions 78a of the second wiring layer 78 are exposed to form the third electrode pads 79.

Next, the solder balls 54 are fixed to the top surfaces 52a of the electrode posts 52 exposed at the first sealing portion 40, with the result that the external terminals 50 are formed.

Finally, the semiconductor substrate 1 is cut along the scrub lines L1, so that the respective chip areas 2 are separated from each other. Each chip area 2 becomes a single semiconductor device 100 that performs a predetermined function.

Fifth Embodiment

The fifth embodiment of the present invention will be described with reference to FIG. 14. The fifth embodiment relates to a structural body in which a plurality of the semiconductor devices 100 (SIP) of the fourth embodiment are laminated. Hereinafter, the structure in which two semiconductor device 100 (SIP) are laminated will be described.

Figure 14:
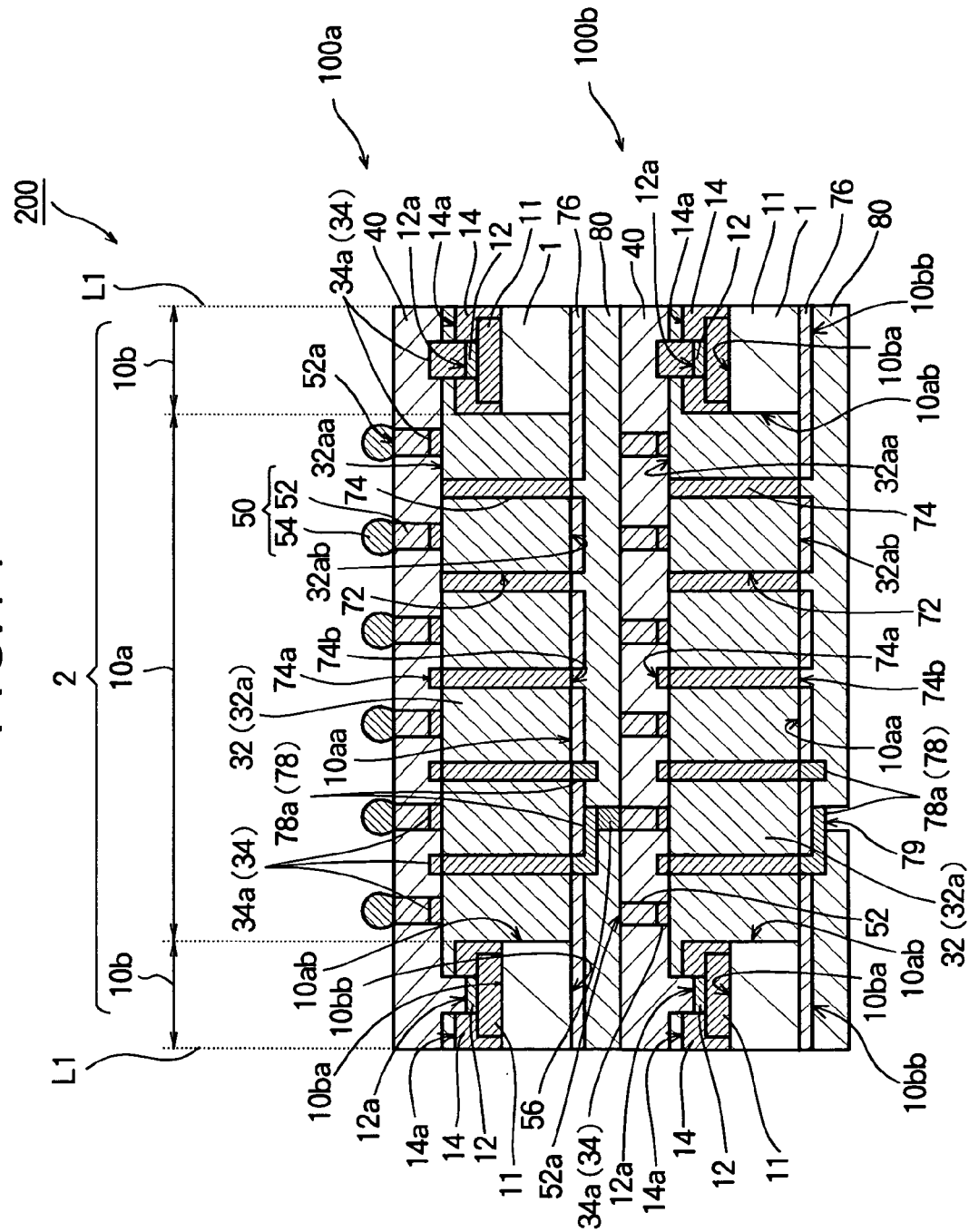
FIG. 14 is a schematic view of a structural body in which two semiconductor devices are laminated.

FIG. 14 is a schematic view of a structural body 200 in which two semiconductor devices 100 described in the fourth embodiment are laminated. FIG. 14 corresponds to the sectional view taken along a line corresponding to Line XIA-XIA in FIGS. 10A and 11B.

First and second semiconductor devices 100a and 100b have the same structures except the arrangements of the external terminals 50. The mountable semiconductor chips 20 (in this example, mountable semiconductor chips 20a and 20b) mounted on the first and second semiconductor devices 100a and 100b are independent from each other. Each of the mountable semiconductor chip 20 can be the same as, or different from the other semiconductor chip 20 mounted on the same semiconductor chip (or other semiconductor chips mounted on the other semiconductor chip).

The external terminals 50 of the second semiconductor device 100b are electrically connected to the exposed third electrode pads 79 of the first semiconductor device 100a. The shapes of the first and second semiconductor devices 100a and 100b as seen from above are the same as each other, so that the side surfaces of the first semiconductor device 100a and the corresponding side surfaces of the second semiconductor device 100b are aligned on the same planes.

The semiconductor devices 100a and 100b include the frame-shaped semiconductor devices 10 having the same shapes, and therefore it becomes easy to obtain a laminated structural body including a plurality of laminated semiconductor devices. Therefore, it becomes possible to reduce the mounting area of the laminated structural body on the mounting board.

The third electrode pads 79 of the first semiconductor device 100a and the external terminals 50 of the second semiconductor device 100b are connected to each other by means of, for example, selected conventional electric conductive bumps 56 and by means of a suitable process for the selected electric conductive bumps 56.

The electric conductive bumps 56 can be previously placed on the third electrode pads 79 of the first semiconductor device 100a as parts of the external terminals. Alternatively, the electrical conductive bump 56 can be replaced by the solder balls as the external terminals 50 of the second semiconductor device 100b.

The external terminals 50 and the third electrode pads 79 of the laminated semiconductor devices 100 are previously aligned with each other. It is preferable that the external terminals 50 and the third electrode pads 79 are aligned with each other in such manner that the third electrodes 79 are disposed on positions facing the external terminals 50. With such an alignment, the semiconductor devices 100 can be easily laminated.

In the above example, two semiconductor devices 100 are laminated. However, it is possible to laminate three or more semiconductor devices 100, with the result that a further multifunctional package can be obtained.

Moreover, the semiconductor devices 100 can be electrically connected to each other by short wirings, and therefore the operating speed of the package can be enhanced.

According to the present invention, at least one mountable semiconductor chip can be mounted in the opening portion of the frame-shaped semiconductor device, and can be electrically connected to the electric elements of the frame portions. Thus, the electric elements can be incorporated in a package, and therefore the functions of the semiconductor chips mounted in the package can be enhanced. Moreover, since the electric elements and the mountable semiconductor chip are separated from each other, the effect of noise can be reduced, and therefore the stable operation of the semiconductor device is ensured.

Particularly, since the mountable semiconductor chip can be disposed apart from the side surfaces of the opening portion of the frame-shaped semiconductor device, it becomes possible to prevent the false operation of the electric elements caused by the noise generated by the mountable semiconductor chip.

Additionally, since the electric elements can be incorporated in the package, the mounting density of the semiconductor devices on the mounting board can be increased.

Moreover, since the external terminals can be formed on the frame portion of the frame-shaped semiconductor device, it becomes possible to increase the freedom in designing the intervals and positions of the external terminals.

While the preferred embodiments of the present invention have been illustrated in detail, it should be apparent that modifications and improvements may be made to the invention without departing from the spirit and scope of the invention as described in the following claims.

What is claimed is:

1. A semiconductor device, comprising:
   a semiconductor substrate that has an opening defined therein and that is comprised of:
      a frame portion defining a periphery of said opening,
      at least one electric element provided on said frame portion and having at least one electrode terminal, and
      a first insulation film formed on said frame portion so that said electrode terminal is partially exposed at said first insulation film to form a plurality of first electrode pads;
   at least one mountable semiconductor chip mounted in said opening so that each said mountable semiconductor chip is apart from inner surfaces of said frame portion, each said mountable semiconductor chip comprising first and second main surfaces, said first main surface being aligned with a surface of said first insulation film facing away from said frame portion and having a second electrode pad provided thereon, and said second main surface being positioned opposite to said first main surface;
   a second insulation film formed on said first insulation film and said first main surface, and filled in said opening to form a filled portion so that said first and second electrode pads are exposed;
   a first wiring layer electrically connected to at least one of said first and second electrode pads, extending on said second insulation film, and including a plurality of first wiring portions, said first wiring portions including a wiring section that electrically connects said first and second electrode pads;
   a plurality of external terminals electrically connected to said plurality of first wiring portions; and
   a first sealing portion formed on said first wiring layer and said second insulation film so that said plurality of external terminals are exposed.

2. The semiconductor device according to claim 1, wherein said electric element is a passive element.

3. The semiconductor device according to claim 1, wherein said external terminal is an electrode post whose top surface is exposed at said first sealing portion.

4. The semiconductor device according to claim 3, wherein said external terminal includes said electrode post and a solder ball connected to said top surface of said electrode post.

5. The semiconductor device according to claim 1, wherein said opening is a concave section that reaches the inside of said semiconductor substrate from the surface of said semiconductor substrate, said concave section having a bottom surface and side surfaces.

6. The semiconductor device according to claim 1, wherein said opening is a first through hole that penetrates said semiconductor substrate.

7. The semiconductor device according to claim 6, further comprising a lower base that supports said second main surface of said mountable semiconductor chip and a bottom surface of said frame portion.

8. The semiconductor device according to claim 7, wherein said lower base is made of a plate member having a light-shielding property.

9. The semiconductor device according to claim 7, wherein said lower base is made of a plate member having a heat radiation property.

10. The semiconductor device according to claim 7, wherein said lower base is made of a plate member having a shielding property of radiation noise.

11. The semiconductor device according to claim 6, further comprising:

a second through hole that penetrates said filled portion;

an embedded wiring portion formed in said second through hole and having a first end connected to said first wiring portion;

a third insulation film that covers said second main surface of said mountable semiconductor chip and a bottom surface of said frame portion so that a second end of said embedded wiring portion is exposed;

a second wiring layer electrically connected to said second end of said embedded wiring portion and including a plurality of second wiring portions extending on said third insulation film; and a second sealing portion that covers said second wiring portions so that said second wiring portions are partially exposed.

12. The semiconductor device according to claim 11, wherein a plurality of said mountable semiconductor chips are mounted in said opening in such a manner that said mountable semiconductor chips are apart from each other.

13. The semiconductor device according to claim 12, wherein said second through hole and said embedded wiring portion are formed on said filled portion between said plurality of mountable semiconductor chips.

* * * * *